US010944003B2

United States Patent
You et al.

(10) Patent No.: US 10,944,003 B2
(45) Date of Patent: *Mar. 9, 2021

(54) VERTICAL FIELD EFFECT TRANSISTOR AND SEMICONDUCTOR DEVICE INCLUDING THE SAME

(71) Applicant: SAMSUNG ELECTRONICS CO., LTD., Suwon-si (KR)

(72) Inventors: Jung-Gun You, Gyeonggi-do (KR); Chang-Hee Kim, Suwon-si (KR); Sung-Il Park, Suwon-si (KR); Dong-Hun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/816,908

(22) Filed: Mar. 12, 2020

(65) Prior Publication Data

US 2020/0220012 A1 Jul. 9, 2020

Related U.S. Application Data

(63) Continuation of application No. 16/044,584, filed on Jul. 25, 2018, now Pat. No. 10,629,729.

(30) Foreign Application Priority Data

Sep. 11, 2017 (KR) .......................... 10-2017-0116126

(51) Int. Cl.
*H01L 29/78* (2006.01)
*H01L 29/66* (2006.01)
(Continued)

(52) U.S. Cl.
CPC ...... *H01L 29/7827* (2013.01); *H01L 21/3083* (2013.01); *H01L 21/823842* (2013.01);
(Continued)

(58) Field of Classification Search
CPC .......... H01L 29/7827; H01L 29/66666; H01L 29/0653; H01L 29/42376; H01L 21/3083;
(Continued)

(56) References Cited

U.S. PATENT DOCUMENTS 5,914,504 A * 6/1999 Augusto ............. H01L 31/0328
257/192
6,770,534 B2 8/2004 Cho et al.
(Continued)

FOREIGN PATENT DOCUMENTS

| CN | 102648514 | 8/2012 |
| CN | 104795440 | 7/2015 |
| CN | 106298926 | 1/2017 |

OTHER PUBLICATIONS

Yang et al. 25-nm p-Channel Vertical MOSFET's with SiGeC source-Drains. IEEE Electron Device Letters, vol. 20, No. 6, (Jun. 1999) (Year: 1999).*
(Continued)

*Primary Examiner* — Matthew C Landau
*Assistant Examiner* — Eric K Ashbahian
(74) *Attorney, Agent, or Firm* — F. Chau & Associates, LLC

(57) ABSTRACT

A vFET includes a first impurity region doped with first impurities at an upper portion of the substrate. A first diffusion control pattern is formed on the first impurity region. The first diffusion control pattern is configured to control the diffusion of the first impurities. A channel extends in a vertical direction substantially orthogonal to an upper surface of the substrate. A second impurity region is doped with second impurities on the channel. A second diffusion control pattern is between the channel and the second impurity region. The second diffusion control pattern
(Continued)

is configured to control the diffusion of the second impurities. A gate structure is adjacent to the channel.

20 Claims, 20 Drawing Sheets

(51) Int. Cl.
| | |
|---|---|
| *H01L 29/06* | (2006.01) |
| *H01L 29/10* | (2006.01) |
| *H01L 21/8238* | (2006.01) |
| *H01L 23/532* | (2006.01) |
| *H01L 21/308* | (2006.01) |
| *H01L 29/423* | (2006.01) |
| *H01L 29/165* | (2006.01) |
| *H01L 21/8234* | (2006.01) |

(52) U.S. Cl.
CPC .. *H01L 21/823885* (2013.01); *H01L 23/5329* (2013.01); *H01L 29/0649* (2013.01); *H01L 29/1037* (2013.01); *H01L 29/4232* (2013.01); *H01L 29/66553* (2013.01); *H01L 29/66666* (2013.01); *H01L 21/3081* (2013.01); *H01L 21/823481* (2013.01); *H01L 21/823487* (2013.01); *H01L 29/165* (2013.01)

(58) Field of Classification Search
CPC ......... H01L 21/02236; H01L 21/02255; H01L 21/2255; H01L 21/823487; H01L 21/823885; H01L 29/78642
See application file for complete search history.

(56) References Cited

U.S. PATENT DOCUMENTS

| | | | |
|---|---|---|---|
| 6,943,407 B2 | 9/2005 | Ouyang et al. | |
| 8,466,017 B2 | 6/2013 | Sheridan et al. | |
| 8,492,257 B2 | 7/2013 | Shin | |
| 9,245,989 B2 | 1/2016 | Then et al. | |
| 9,443,858 B2 | 9/2016 | Myung et al. | |
| 9,564,514 B2 | 2/2017 | Basu et al. | |
| 9,680,012 B1* | 6/2017 | Diaz | H01L 29/7827 |
| 9,735,246 B1* | 8/2017 | Basker | C23C 16/401 |
| 9,954,102 B1 | 4/2018 | Mochizuki et al. | |
| 10,629,729 B2* | 4/2020 | You | H01L 21/823885 |
| 2010/0327319 A1* | 12/2010 | Iacopi | H01L 29/7391 |
| | | | 257/192 |
| 2015/0380548 A1 | 12/2015 | Wang et al. | |
| 2017/0062525 A1 | 3/2017 | Ting et al. | |
| 2017/0084753 A1 | 3/2017 | Lien et al. | |
| 2017/0148876 A1 | 5/2017 | Cheng et al. | |
| 2017/0148897 A1 | 5/2017 | Cheng et al. | |
| 2017/0373159 A1 | 12/2017 | Cheng et al. | |
| 2017/0373188 A1 | 12/2017 | Mochizuki et al. | |
| 2018/0212040 A1 | 7/2018 | Bao et al. | |
| 2018/0226489 A1* | 8/2018 | Bi | H01L 29/66666 |
| 2018/0248034 A1* | 8/2018 | Leobandung | H01L 21/823481 |
| 2018/0254218 A1* | 9/2018 | Cheng | H01L 28/88 |
| 2018/0350695 A1 | 12/2018 | Cheng et al. | |
| 2018/0350951 A1* | 12/2018 | Yamashita | H01L 29/165 |
| 2018/0358452 A1* | 12/2018 | Qi | H01L 29/78618 |
| 2019/0081174 A1 | 3/2019 | You et al. | |

OTHER PUBLICATIONS

Chinese Office Action dated Sep. 10, 2020 in corresponding Chinese Application No. 201811054979.5, in Chinese (5 pages).

* cited by examiner

VERTICAL FIELD EFFECT TRANSISTOR AND SEMICONDUCTOR DEVICE INCLUDING THE SAME

CROSS-REFERENCE TO RELATED APPLICATION

This application is a continuation of U.S. application Ser. No. 16/044,584, filed on Jul. 25, 2018, which claims priority under 35 USC § 119 to Korean Patent Application No. 10-2017-0116126, filed on Sep. 11, 2017 in the Korean Intellectual Property Office (KIPO), the disclosures of which are incorporated by reference herein in their entirety.

TECHNICAL FIELD

Exemplary embodiments of the present inventive concept relate to a vertical field effect transistor (vFET), and more particularly to a semiconductor device including the same.

DISCUSSION OF RELATED ART

In a vFET, currents may flow in a vertically extending channel, and may be influenced by doping concentrations of upper and lower impurity regions disposed over and under the channel, respectively, and distances between a gate structure surrounding the channel and the impurity regions. In a semiconductor device including a plurality of vFETs, if doping concentrations of impurity regions in the vFETs or distances between a gate structure and the impurity regions are not uniform, the reliability of the semiconductor device may be degenerated.

SUMMARY

According to an exemplary embodiment of the present invention, a field effect transistor (vFET) includes a first impurity region doped with first impurities at an upper portion of the substrate. A first diffusion control pattern is formed on the first impurity region. The first diffusion control pattern is configured to control the diffusion of the first impurities. A channel extends in a vertical direction substantially orthogonal to an upper surface of the substrate. A second impurity region is doped with second impurities on the channel. A second diffusion control pattern is between the channel and the second impurity region. The second diffusion control pattern is configured to control the diffusion of the second impurities. A gate structure is adjacent to the channel.

According to an exemplary embodiment of the present invention, a semiconductor device includes a first impurity region doped with first impurities at an upper portion of a substrate. A first diffusion control is on the first impurity region. The first diffusion control pattern is configured to control the diffusion of the first impurities. Channels are spaced apart from each other on the first diffusion control pattern along a direction parallel to an upper surface of the substrate. Each of the channels extends in a vertical direction substantially orthogonal to the upper surface of the substrate. A second impurity region is doped with second impurities and is positioned above the channels. A second diffusion control pattern is between each of the channels and the second impurity region. The second diffusion control pattern is configured to control the diffusion of the second impurities. Gate structures are adjacent to the channels.

According to an exemplary embodiment of the present invention, a semiconductor device includes first diffusion control patterns spaced apart from each other on a substrate. First impurity regions are doped with first impurities at upper portions of the substrate below the first diffusion control patterns. Channels are on the first diffusion control patterns. Each of the channels extends in a vertical direction substantially orthogonal to an upper surface of the substrate. A second impurity region is doped with second impurities and is positioned above the channels. A second diffusion control pattern is between each of the channels and the second impurity region. The second diffusion control pattern is configured to control the diffusion of the second impurities. Gate structures are adjacent to the channels.

According to an exemplary embodiment of the present invention, a semiconductor device includes a substrate and a first impurity region positioned at an upper portion of the substrate. A first diffusion control pattern is disposed on the first impurity region. The first diffusion control pattern includes a plurality of protrusions extending in a direction orthogonal to an upper surface of the substrate. At least two channels are positioned above a protrusion of the plurality of protrusions. A gate structure is positioned between the at least two channels. A second diffusion control pattern is positioned above the at least two channels. The second diffusion control pattern is positioned above an upper surface of the gate structure along the direction orthogonal to the upper surface of the substrate. A second impurity region is disposed on the second diffusion control pattern. An upper surface of the second impurity region has a zigzag shape. A metal silicide pattern is disposed on the upper surface of the second impurity region.

According to an exemplary embodiment of the present invention, the distances between the gate structures and lower and upper impurity regions may be substantially constant or may have small distributions, and thus the semiconductor device may have increased speed and reliability.

DESCRIPTION OF EMBODIMENTS

Figure 1:
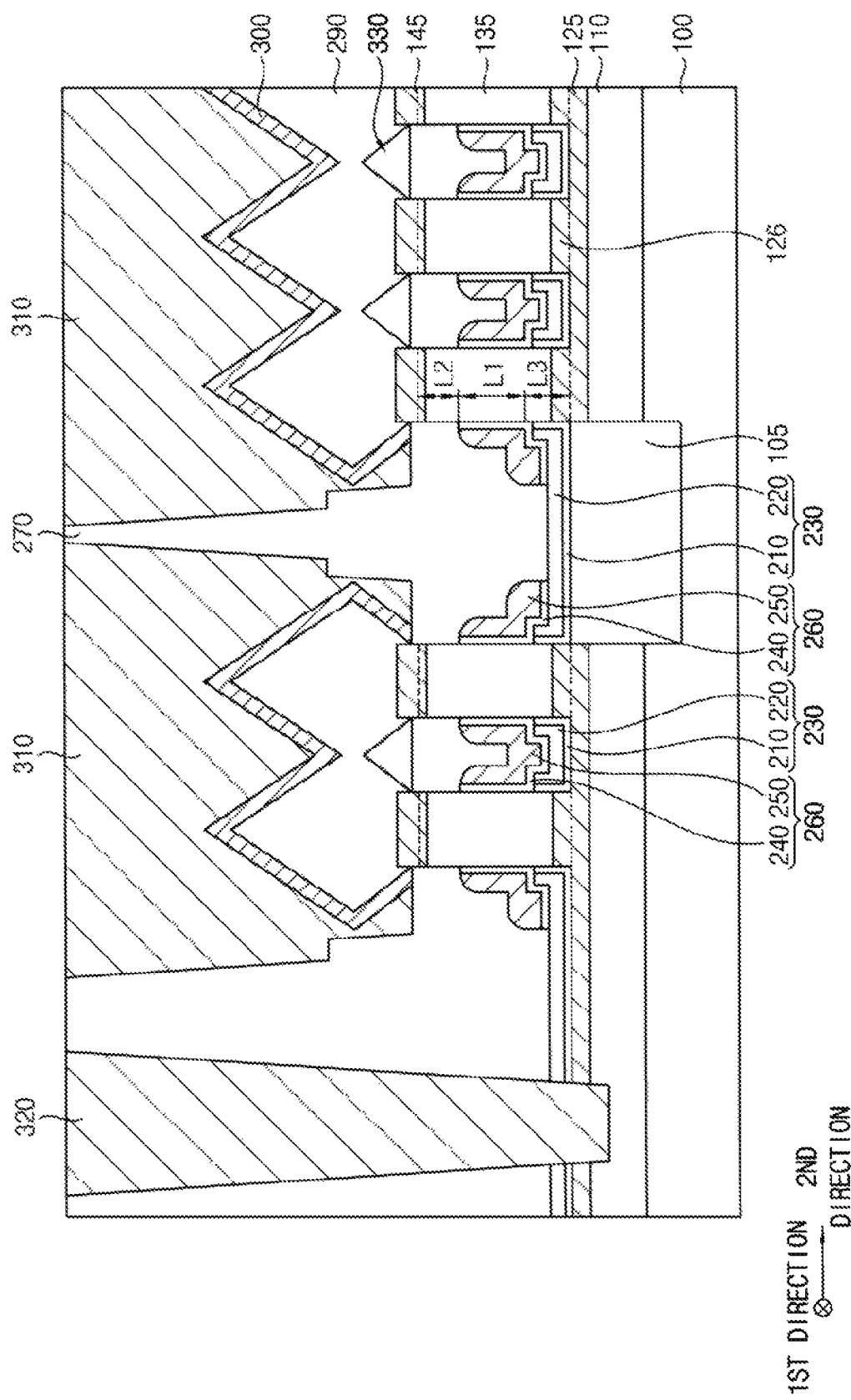
FIG. 1 is a cross-sectional view illustrating a semiconductor device in accordance with an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

Herein, a direction substantially perpendicular to an upper surface of a substrate 100 may be defined as a vertical direction (e.g., a direction orthogonal to an upper surface of the substrate 100), and a direction substantially parallel to the upper surface of the substrate 100 may be defined as a horizontal direction. Two directions of the horizontal direction crossing each other may be defined as first and second directions, respectively. The first and second directions may be perpendicular to each other.

FIG. 1 is a cross-sectional view illustrating a semiconductor device in accordance with an exemplary embodiment of the present invention.

Referring to FIG. 1, the semiconductor device may include a first impurity region 110 at an upper portion of a substrate 100, a first diffusion control pattern 125, a channel 135, a second diffusion control pattern 145, and a second impurity region 290 sequentially stacked on the first impurity region 110. A gate structure 260 may be adjacent to the channel 135. The gate structure 260 may surround at least a portion of the channel 135. For example, the gate structure 260 may be disposed on sidewalls of the channel 135.

The semiconductor device may include a spacer 230, first and second electrodes 310 and 320, a metal silicide pattern 300, an isolation pattern 105, and an insulating interlayer 270. The spacer 230 may be disposed on a portion of the sidewalls of the channel 135.

The substrate 100 may include a semiconductor material, e.g., silicon, germanium, silicon-germanium, or III-V semiconductor compounds, e.g., GaP, GaAs, or GaSb. In an exemplary embodiment of the present invention, the substrate 100 may be a silicon-on-insulator (SOI) substrate, or a germanium-on-insulator (GOI) substrate.

When a p-type vFET is formed on the substrate 100, n-type impurities, e.g., phosphorus, or arsenic may be doped into the substrate 100. When an n-type vFET is formed on the substrate 100, p-type impurities, e.g., boron, or aluminum may be doped into the substrate 100.

The first impurity region 110 may be formed at the upper portion of the substrate 100, and may include first impurities. When a p-type vFET is formed on the substrate 100, the first impurities may include p-type impurities, and when an n-type vFET is formed on the substrate 100, the first impurities may include n-type impurities.

The first impurity region 110 may be divided into a plurality of parts in the second direction by the isolation pattern 105 on the substrate 100. Thus, a bottom surface of the isolation pattern 105 may be lower than or coplanar with a bottom surface of the first impurity region 110, and a top surface of the isolation pattern 105 may be higher than or coplanar with a top surface of the first impurity region 110 (e.g., along a direction orthogonal to an upper surface of the substrate 100). The isolation pattern 105 may include an oxide, e.g., silicon oxide. The first impurity region 110 may be further divided into a plurality of parts in the second direction by the second electrode 320.

The first diffusion control pattern 125 may be formed on the first impurity region 110, and may prevent or control the diffusion of the first impurities doped in the first impurity region 110. In an exemplary embodiment of the present invention, a plurality of first diffusion control patterns 125 may be formed in the second direction, which may be spaced apart from each other by the isolation pattern 105. The plurality of first diffusion control patterns 125 may be further spaced apart from each other by the second electrode 320.

Each of the first diffusion control pattern 125 may have an uneven upper surface. For example, each of the first diffusion control patterns 125 may have a plurality of protrusions 126, which may protrude in the vertical direction (e.g., along a direction orthogonal to an upper surface of the substrate 100).

In an exemplary embodiment of the present invention, the first diffusion control pattern 125 may include undoped silicon-germanium. Alternatively, when a p-type vFET is formed on the substrate 100, the first diffusion control pattern 125 may include silicon-germanium doped with n-type impurities or silicon doped with n-type impurities, and when an n-type vFET is formed on the substrate 100, the first diffusion control pattern 125 may include silicon-germanium doped with p-type impurities or silicon doped with p-type impurities.

A lower portion of the first diffusion control pattern 125 may further include the first impurities doped in the first impurity region 110, which may be diffused from the first impurity region 110 upwardly by a heat treatment process for activating the first impurity region 110 subsequently illustrated with reference to FIG. 3. The lower portion of the first diffusion layer may refer to a portion of the first diffusion control pattern 125 positioned below the protrusions 126.

Referring to FIG. 1, a height to which the first impurities are diffused in the first diffusion control pattern 125 may be shown by a dotted line. Even though the height is substantially coplanar with bottoms of the protrusions 126 of the first diffusion control pattern 125 in FIG. 1, exemplary embodiments of the present invention are not limited thereto. Even though the height is substantially coplanar with the top surface of the isolation pattern 105 in FIG. 1, exemplary embodiments of the present invention are not limited thereto.

The channel 135 may be formed on each of the protrusions 126 of the first diffusion control pattern 125, and may extend in the vertical direction (e.g., along a direction orthogonal to an upper surface of the substrate 100). A plurality of channels 135 may be formed in the second direction on the respective protrusions 126 of the first diffusion control pattern 125. In an exemplary embodiment of the present invention, the channels 135 may each include undoped silicon.

The second diffusion control pattern 145 may be formed on each channel 135. In an exemplary embodiment of the present invention, the second diffusion control pattern 145 may include undoped silicon-germanium. Alternatively, when a p-type vFET is formed on the substrate 100, the second diffusion control pattern 145 may include silicon-germanium doped with n-type impurities or silicon doped with n-type impurities, and when an n-type vFET is formed on the substrate 100, the second diffusion control pattern 145 may include silicon-germanium doped with p-type impurities or silicon doped with p-type impurities.

An upper portion of the second diffusion control pattern 145 may further include second impurities doped in the second impurity region 290, which may be diffused from the second impurity region 290 downwardly by a heat treatment process for forming the metal silicide pattern 300 described in more detail below with reference to FIG. 13.

Referring to FIG. 1, a depth to which the second impurities are diffused in the second diffusion control pattern 145 is shown by a dotted line. Even though the depth exists in the second diffusion control pattern 145 in FIG. 1, exemplary embodiments of the present invention are not limited thereto, and in an exemplary embodiment of the present invention, the second impurities may be diffused into an upper portion of the channel 135 through the second diffusion control pattern 145. Thus, the depth to which the second impurities may be diffused may exist not in the second diffusion control pattern 145 but under a bottom surface of the second diffusion control pattern 145. However, the depth to which the second impurities may be diffused may be higher than at least a top surface of the gate structure 260.

A plurality of second diffusion control patterns 145 may be formed on the respective channels 135 in the second direction.

The channel 135 and the second diffusion control pattern 145 sequentially stacked on the protrusions 126 of the first diffusion control pattern 125 may form a fin structure. In an exemplary embodiment of the present invention, the fin structure may extend in the first direction, and a plurality of fin structures may be formed in the second direction.

A plurality of neighboring fin structures may form a fin structure group. Referring to FIG. 1, a first fin structure group including neighboring two fin structures and a second fin structure group including neighboring three fin structures are shown as an example; however, exemplary embodiments of the present invention are not limited thereto. The semiconductor device may include a plurality of fin structure groups, and each of the fin structure groups may include a plurality of neighboring fin structures. In an exemplary embodiment of the present invention, some of the plurality of fin structure groups may include only one fin structure.

The second impurity region 290 may be formed by a selective epitaxial growth (SEG) process (e.g., by the SEG process described in more detail below with reference to FIG. 12), and may be grown in both of the vertical and horizontal directions to have a cross-section having a shape of a pentagon or a hexagon. An upper surface of the second impurity region 290 may include a first surface having a positive slope and a second surface having a negative slope and contacting the first surface, and thus may have a sharp shape. For example, the upper surface of the second impurity region 290 may have a zigzag shape.

However, in an exemplary embodiment of the present invention, when the neighboring fin structures in each of the first and second fin structure groups are relatively close to each other in the second direction, the second impurity regions 290 may be merged with each other. For example, one merged second impurity region 290 may be formed on each fin structure group, and the merged second impurity region 290 may have an uneven upper surface. An air gap 330 may be formed under the merged second impurity region 290.

In an exemplary embodiment of the present invention, when a p-type vFET is formed on the substrate 100, the second impurity region 290 may include a single crystalline silicon-germanium layer doped with p-type impurities, and when an n-type vFET is formed on the substrate 100, the second impurity region 290 may include a single crystalline silicon layer doped with n-type impurities or a single crystalline silicon carbide layer doped with n-type impurities.

The spacer 230 may cover lower portions of the fin structures, for example, a lower portion of the channel 135 and the protrusions 126 of the first diffusion control pattern 125, and may extend in the second direction on the first diffusion control pattern 125 and the isolation pattern 105.

In an exemplary embodiment of the present invention, the spacer 230 may include first and second patterns 210 and 220 sequentially stacked. The first pattern 210 may at least partially cover the fin structure, for example, a lower sidewall of the channel 135, a sidewall of the protrusions 126 of the first diffusion control pattern 125, an upper surface of the first diffusion control pattern 125, and an upper surface of the isolation pattern 105, and the second pattern 220 may be formed (e.g., conformally formed) on the first pattern 210. Thus, the first and second patterns 210 and 220 may be sequentially stacked on the lower sidewall of the channel 135 in the horizontal direction.

The first pattern 210 may include an oxide, e.g., silicon oxide, and the second pattern 220 may include a nitride, e.g., silicon nitride, or an oxide, e.g., borophospho silicate gate (BPSG).

The gate structure 260 may be formed on the spacer 230, and may at least partially cover the fin structure. For example, the gate structure 260 and the spacer 230 may cover at least a portion of sidewalls of the channel 135 in the vertical direction. The gate structure 260 may include a gate insulation pattern 240 and a gate electrode 250 sequentially stacked.

The gate insulation pattern 240 may cover the central portion of the channel 135 and at least a portion of an upper surface of the spacer 230, and the gate electrode 250 may be formed on the gate insulation pattern 240. Thus, the gate insulation pattern 240 and the gate electrode 250 may be sequentially stacked on the sidewalls of the channel 135 in the horizontal direction.

In an exemplary embodiment of the present invention, when a distance between the fin structures in each of the first and second fin structure groups is relatively small, the gate structure 260 may extend in the second direction to commonly cover central portions of the fin structures in each of the first and second fin structure groups. Alternatively, when the distance between the fin structures in each of the first and second fin structure groups is relatively large, a plurality of gate structures 260 may be formed in the second direction to cover the respective portions (e.g., central portions) of the fin structures in each of the first and second fin structure groups. However, one of the gate structures 260 covering the fin structures in the first fin structure group and another one of the gate structures 260 covering the fin structures in the second fin structure group need not contact each other but may be spaced apart from each other.

The gate insulation pattern 240 may include a high-k dielectric material, e.g., a metal oxide such as hafnium oxide, tantalum oxide, or zirconium oxide, and the gate electrode 250 may include a metal having a relatively low resistance, e.g., aluminum, copper, or tantalum, or a metal nitride.

A workfunction control pattern may be further formed between the gate insulation pattern 240 and the gate electrode 250, and may include a metal nitride or a metal alloy, e.g., titanium nitride, titanium aluminum, titanium aluminum nitride, tantalum nitride, or tantalum aluminum nitride.

The insulating interlayer 270 may be formed on the spacer 230, and may cover the gate structure 260 and sidewalls of the fin structures. The insulating interlayer 270 may include an oxide, e.g., silicon oxide.

The metal silicide pattern 300 may be formed on a surface (e.g., an upper surface) of the second impurity region 290. In an exemplary embodiment of the present invention, the metal silicide pattern 300 may have a substantially constant thickness. The second impurity region 290 may have the uneven surface (e.g., a zigzag shaped upper surface), and thus the metal silicide pattern 300 may also have an uneven surface. The metal silicide pattern 300 may include a metal silicide, e.g., cobalt silicide, or nickel silicide.

The first electrode 310 may be in direct contact with the metal silicide pattern 300, and the second electrode 320 may be in direct contact with an upper surface of the first impurity region 110. Each of the first and second electrodes 310 and 320 may include a metal pattern and a barrier pattern covering a bottom and a sidewall of the metal pattern.

Contact plugs and upper wirings may be further formed on the first and second electrodes 310 and 320.

The semiconductor device may include a vFET having the first impurity region 110, the first diffusion control pattern 125, the channel 135, the second diffusion control pattern 145, and the second impurity region 290 sequentially stacked in the vertical direction. The gate structure 260 may be disposed on at least a portion of a sidewall of the channel 135.

In the vFET, a vertical length of a portion of the gate structure 260 covering a surface (e.g., a sidewall) of the channel 135 through which currents may flow in the vertical direction may be defined as a first length L1, a distance between a point to which the second impurities doped in the second impurity region 290 are diffused and a top end of a portion of the gate structure 260 covering the surface of the channel 135 may be defined as a second length L2, and a distance between a point to which the first impurities doped in the first impurity region 110 are diffused and a bottom end of a portion of the gate structure 260 covering the surface of the channel 135 may be defined as a third length L3.

In an exemplary embodiment of the present invention, the second and third lengths L2 and L3 may be controlled by the second and first diffusion control patterns 145 and 125, respectively. In the heat treatment process for activating the first impurity region 110, the first impurities doped in the first impurity region 110 may be diffused upwardly (e.g., along a direction orthogonal to an upper surface of the substrate 100), however, the first diffusion control pattern 125 including a material different from that of the first impurity region 110 and/or impurities having different conductivity type may be formed on the first impurity region 110, and thus the diffusion of the first impurities may be prevented or controlled so that the third length L3 may be controlled. Additionally, the distribution of the heights of the diffusion of the first impurities may be reduced in the plurality of vFETs, and thus the third length L3 may have a substantially constant value or relatively small variations in the plurality of vFETs.

Likewise, in the heat treatment process for forming the metal silicide pattern 300 on the second impurity region 290, the second impurities doped in the second impurity region 290 may be diffused downwardly (e.g., along a direction orthogonal to an upper surface of the substrate 100), however, the second diffusion control pattern 145 including a material different from that of the second impurity region 290 and/or impurities having different conductivity type may be formed under the second impurity region 290, and thus the diffusion of the second impurities may be prevented or controlled so that the second length L2 may be controlled. Additionally, the distribution of the depths of the diffusion of the second impurities may be reduced in the plurality of vFETs, and thus the second length L2 may have a substantially constant value or relatively small variations in the plurality of vFETs.

Accordingly, as each of the second and third lengths L2 and L3 may have substantially a constant value or relatively small variations in the plurality of vFETs, the semiconductor device including the vFETs may have increased speed and reliability.

A semiconductor device according to another exemplary embodiment of the present invention may include the substrate 100 and the first impurity region 110 positioned at an upper portion of the substrate 100. The first diffusion control pattern 125 may be disposed on the first impurity region 110. The first diffusion control pattern 125 may include a plurality of protrusions 126 extending in a direction orthogonal to an upper surface of the substrate 100. At least two channels 135 may be positioned above a protrusion of the plurality of protrusions 126. The gate structure 260 may be positioned between the at least two channels 135. The second diffusion control pattern 145 may be positioned above the at least two channels 135. The second diffusion control pattern 145 may be positioned above an upper surface of the gate structure 260 along the direction orthogonal to the upper surface of the substrate 100 (e.g., by the second length L2). The second impurity region 290 may be disposed on the second diffusion control pattern 145. An upper surface of the second impurity region 290 may have a zigzag shape. The metal silicide pattern 300 may be disposed on the upper surface of the second impurity region 290.

FIGS. 2 to 13 are cross-sectional views illustrating a method of manufacturing a semiconductor device in accordance with an exemplary embodiment of the present invention.

Figure 2:
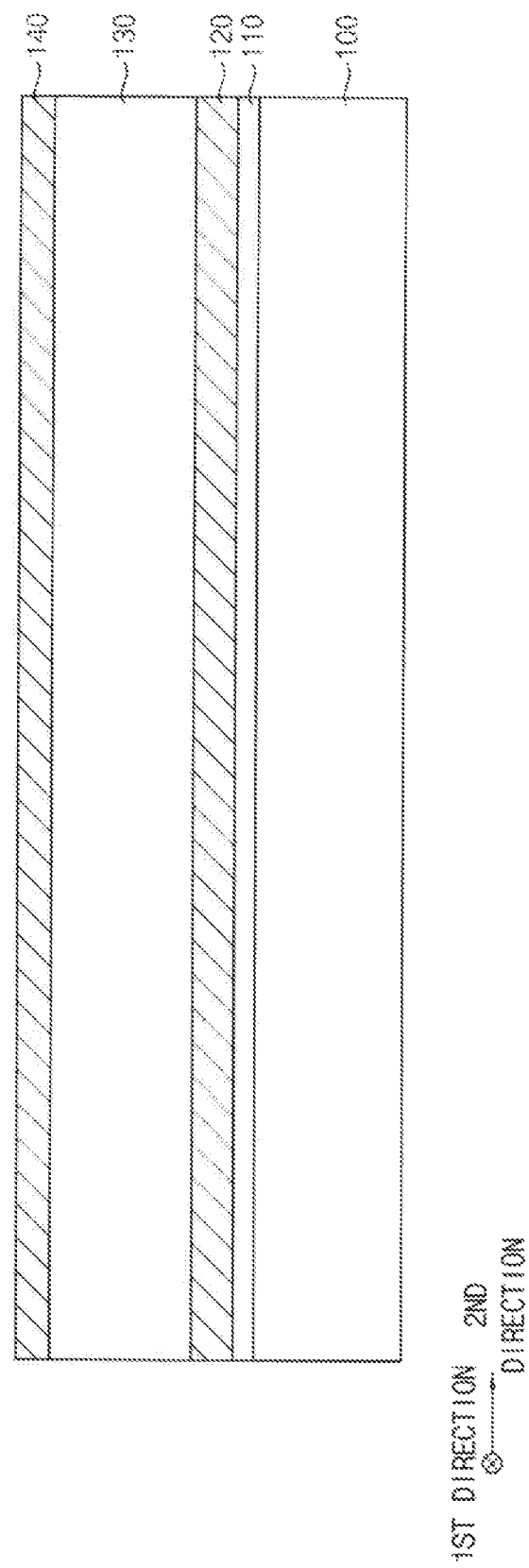
FIGS. 2 to 13 are cross-sectional views illustrating a method of manufacturing a semiconductor device in accordance with an exemplary embodiment of the present invention.

Referring to FIG. 2, the first impurity region 110 may be formed at an upper portion of the substrate 100 by an ion implantation process, and a first diffusion control layer 120, a channel layer 130, and a second diffusion control layer 140 may be sequentially formed on the first impurity region 110.

The substrate 100 may include a semiconductor material, e.g., silicon, germanium, silicon-germanium, or III-V semiconductor compounds, e.g., GaP, GaAs, or GaSb. In an exemplary embodiment of the present invention, the substrate 100 may be a silicon-on-insulator (SOI) substrate, or a germanium-on-insulator (GOI) substrate.

When a p-type vFET is formed on the substrate 100, n-type impurities, e.g., phosphorus, or arsenic may be doped into the substrate 100. When an n-type vFET is formed on the substrate 100, p-type impurities, e.g., boron, aluminum, may be doped into the substrate 100.

When a p-type vFET is formed, the first impurity region 110 may be formed by doping p-type impurities at the upper portion of the substrate 100, and when an n-type vFET is formed, the first impurity region 110 may be formed by doping n-type impurities at the upper portion of the substrate 100. Impurities doped into the first impurity region 110 may be referred to as first impurities.

In an exemplary embodiment of the present invention, each of the first diffusion control layer 120, the channel layer 130, and the second diffusion control layer 140 may be formed by an epitaxial growth process.

In an exemplary embodiment of the present invention, the first diffusion control layer 120 may include undoped silicon-germanium. Alternatively, when a p-type vFET is formed, the first diffusion control layer 120 may include silicon-germanium doped with n-type impurities or silicon doped with n-type impurities, and when an n-type vFET is formed, the first diffusion control layer 120 may include silicon-germanium doped with p-type impurities or silicon doped with p-type impurities.

In an exemplary embodiment of the present invention, the channel layer 130 may include undoped silicon.

In an exemplary embodiment of the present invention, the second diffusion control layer 140 may include undoped silicon-germanium. Alternatively, when a p-type vFET is formed, the first diffusion control layer 120 may include silicon-germanium doped with n-type impurities or silicon doped with n-type impurities, and when an n-type vFET is formed, the first diffusion control layer 120 may include silicon-germanium doped with p-type impurities or silicon doped with p-type impurities.

Figure 3:
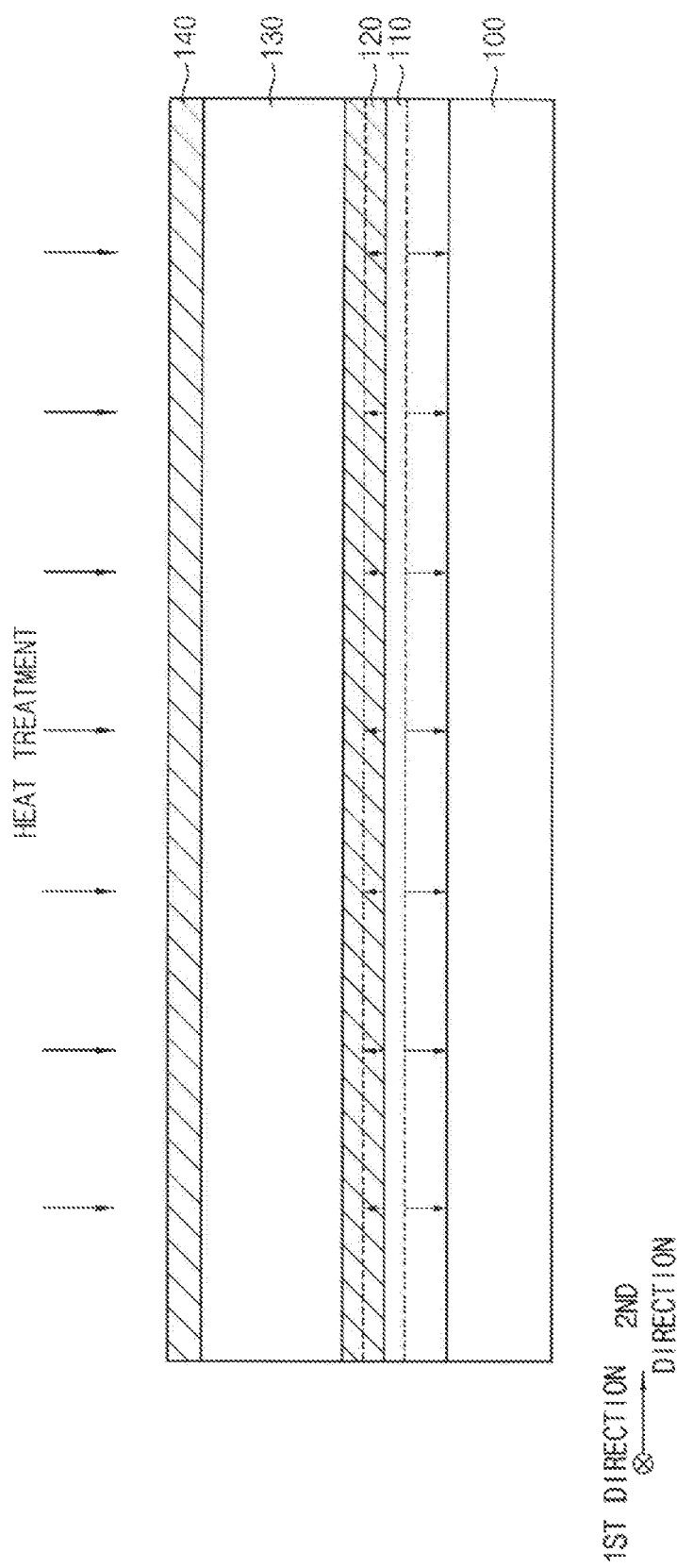

Referring to FIG. 3, a heat treatment process may be performed on the substrate 100 to activate the first impurity region 110.

Thus, the first impurities doped in the first impurity region 110 may be diffused upwardly and downwardly (e.g., along a direction orthogonal to an upper surface of the substrate 100). However, the upward diffusion of the first impurities may be prevented or controlled by the first diffusion control layer 120 on the first impurity region 110, and thus the first impurities may be diffused to a given height in the first diffusion control layer 120.

When compared to a case in which no first diffusion control layer 120 is formed, the degree of the upward diffusion of the first impurities may be reduced, and the distribution of the upward diffusions of the first impurities at a plurality of portions of the first impurity region 110 may be also reduced. Thus, the heights to which the first impurities are diffused at respective portions of the first diffusion control layer 120 may be substantially constant or may have relatively small variations.

A lower portion of the first diffusion control layer 120 may further include the first impurities doped in the first impurity region 110 due to the heat treatment process.

Figure 4:
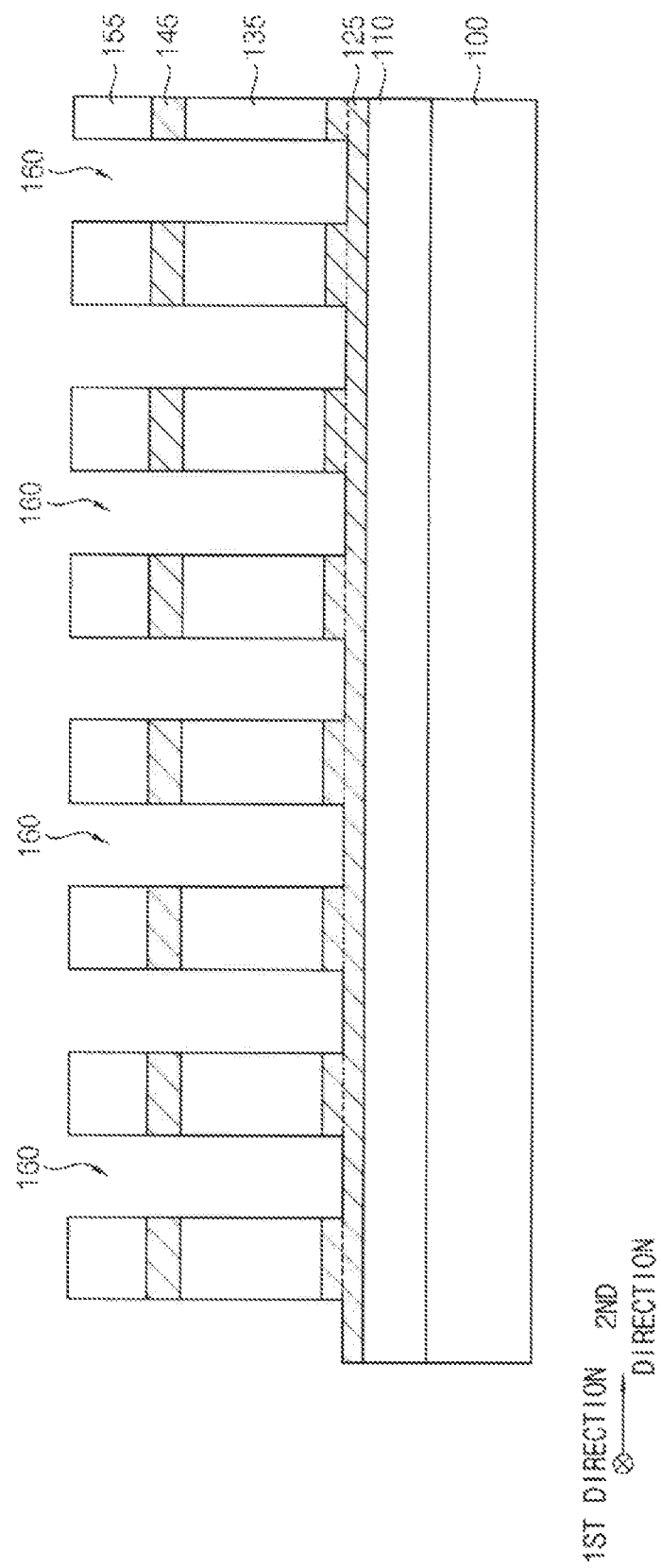

Referring to FIG. 4, after forming a mask 155 on the second diffusion control layer 140, the second diffusion control layer 140, the channel layer 130, and an upper portion of the first diffusion control layer 120 may be etched using the mask 155 as an etching mask to form a first opening 160 exposing a lower portion of the first diffusion control layer 120.

Thus, the first diffusion control layer 120 may be transformed into the first diffusion control layer 125, and a plurality of preliminary fin structures each of which may include the channel 135, the second diffusion control pattern 145, and the mask 155 sequentially stacked on the first diffusion control pattern 125 may be formed in the second direction to be spaced apart from each other. In an exemplary embodiment of the present invention, each of the preliminary fin structures may extend in the first direction to a given length.

Accordingly, as the upper portion of the first diffusion control layer 120 is partially etched, the first diffusion control pattern 125 may have an uneven upper surface. For example, the first diffusion control pattern 125 may include a plurality of protrusions 126 protruding in the vertical direction, and each of the preliminary fin structures may be formed on each of the protrusions 126. However, exemplary embodiments of the present invention are not limited thereto, and for example, the lower portion of the first diffusion control layer 120 may be also etched in the above etching process, so that the first diffusion control pattern 125 may be divided into a plurality of parts in the second direction.

Referring to FIG. 4, the first diffusion control layer 120 may be etched to the height to which the first impurities are diffused in the above etching process; however, exemplary embodiments of the present invention are not limited thereto, and may be etched to a point higher or lower than the height.

Figure 5:
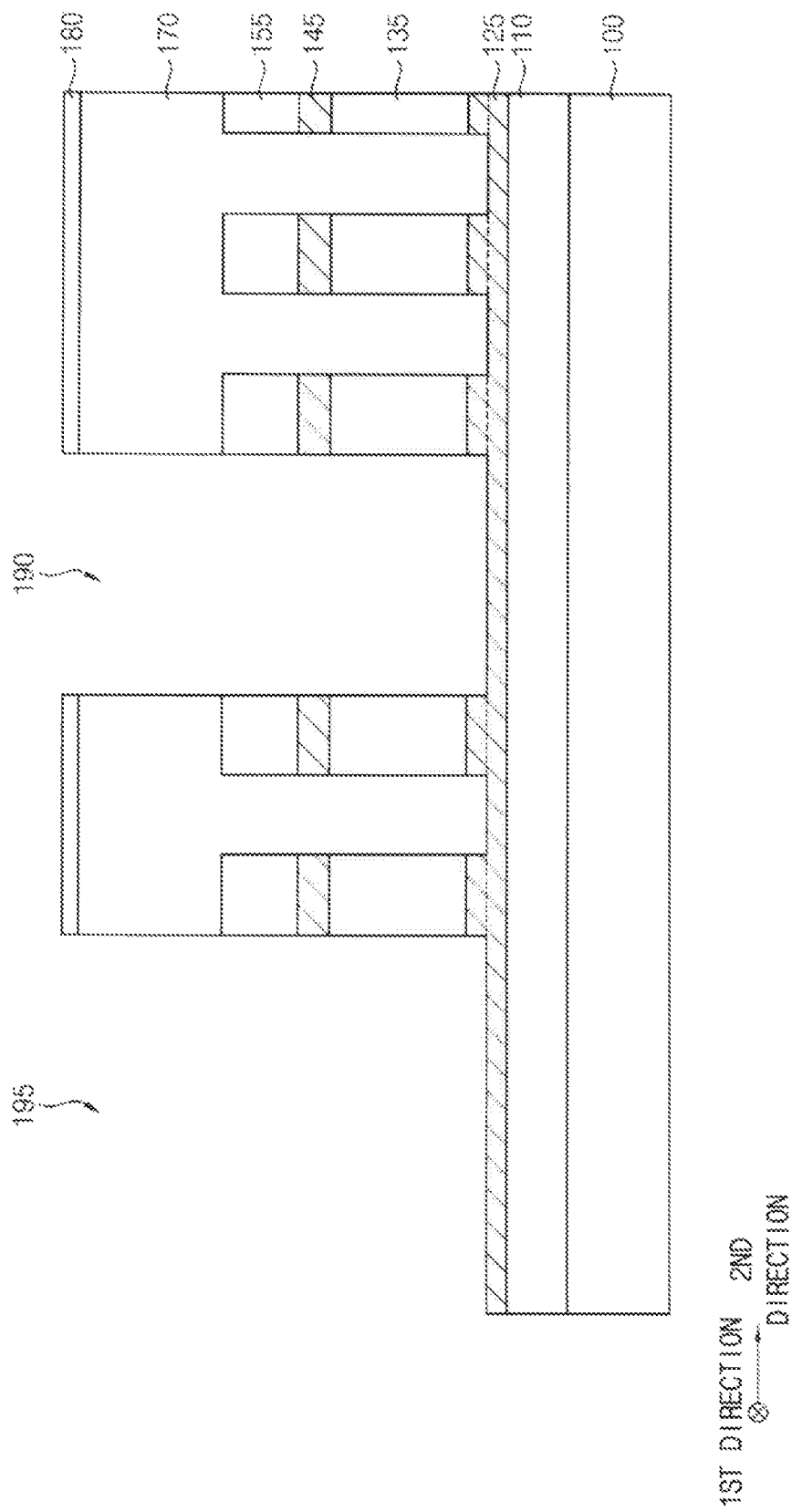

Referring to FIG. 5, first and second etching masks 170 and 180 may be sequentially formed on the first diffusion control pattern 125 having the preliminary fin structures thereon to partially cover the preliminary fin structures, and exposed portions of the preliminary fin structures may be etched using the first and second etching masks 170 and 180.

Thus, second and third openings 190 and 195 may be formed to expose lower portions of the first diffusion control pattern 125.

The first etching mask 170 may include, e.g., spin-on-hardmask (SOH), or amorphous carbon layer (ACL), and the second etching mask 180 may include an oxynitride, e.g., plasma enhanced silicon oxynitride (PE-SiON). During the etching process, the second etching mask 180 may be mostly removed.

Neighboring preliminary fin structures may be referred to as a preliminary fin structure group. Referring to FIG. 5, a first preliminary fin structure group including two neighboring preliminary fin structures and a second preliminary fin structure group including three neighboring preliminary fin structures are shown as an example; however, exemplary embodiments of the present invention are not limited thereto. For example, the semiconductor device may include a plurality of preliminary fin structure groups, and each of the plurality of preliminary fin structure groups may include a plurality of neighboring preliminary fin structures. In an exemplary embodiment of the present invention, some of the plurality of preliminary fin structure groups may include only one preliminary fin structure.

Figure 6:
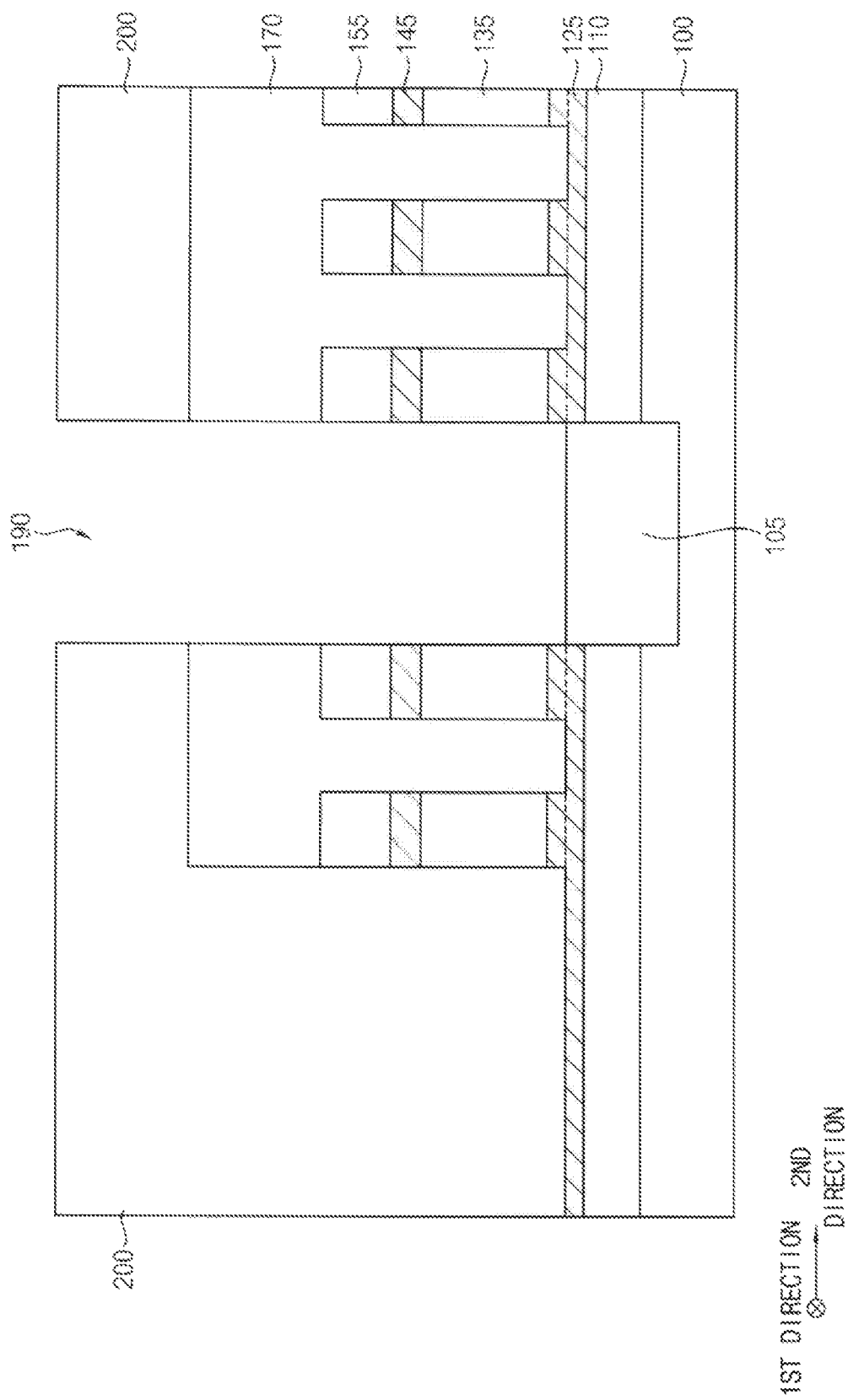

Referring to FIG. 6, a third etching mask 200 may be formed on the first etching mask 170 and the first diffusion control pattern 125 to cover the third opening 195, and a portion of the first diffusion control pattern 125 exposed by the second opening 190 and a portion of the first impurity region 110 thereunder may be etched using the first and third etching masks 170 and 200 to expose a portion of the substrate 100.

The third etching mask 200 may include, e.g., a photoresist pattern. During the etching process, a portion of the substrate 100 under the first impurity region 110 may be removed.

After removing the third etching mask 200 to expose the lower portions of the first diffusion control pattern 125 under the third opening 195, an isolation layer may be formed on the exposed portion of the substrate 100, the exposed portions of the first diffusion control pattern 125, and the first etching mask 170, and may be etched to form an isolation pattern 105. The third etching mask 200 may be removed by, e.g., an ashing process and/or a stripping process.

In an exemplary embodiment of the present invention, the isolation pattern 105 may have a top surface between top and bottom surfaces of the first diffusion control pattern 125 (e.g., along a direction orthogonal to an upper surface of the substrate 100). Referring to FIG. 6, the top surface of the isolation pattern 105 may be substantially coplanar with the diffusion height of the first impurities in the first diffusion control pattern 125; however, exemplary embodiments of the present invention are not limited thereto.

After forming the isolation pattern 105, the first mask 170 may be removed. The first mask 170 may be removed by, e.g., an ashing process and/or a stripping process.

Figure 7:
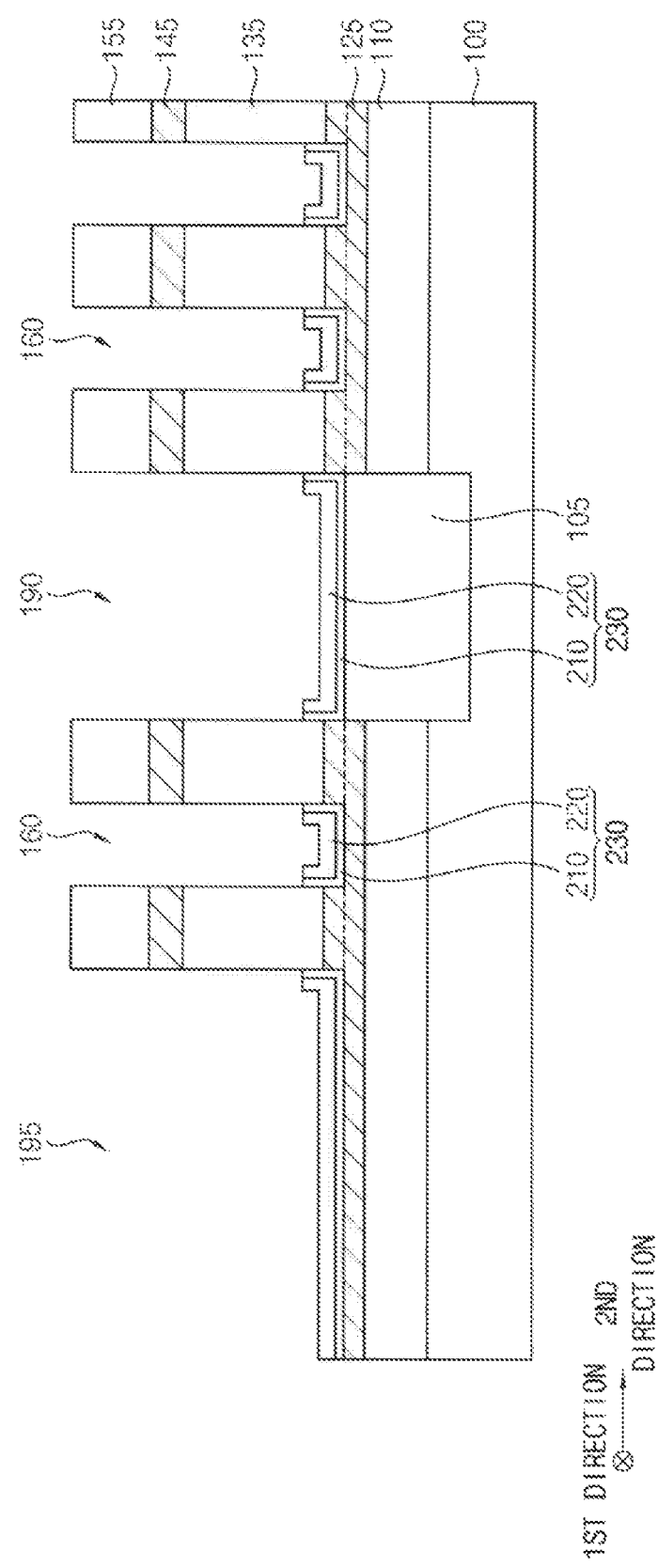

Referring to FIG. 7, first and second layers may be sequentially formed on the first diffusion control pattern 125, the preliminary fin structures, and the isolation pattern 105, and may be etched to form first and second patterns 210 and 220, respectively, covering lower portions of the preliminary fin structure and the protrusions 126 of the first diffusion control pattern 125. The first and second patterns 210 and 220 may form a spacer 230.

In an exemplary embodiment of the present invention, the first layer may be formed by an atomic layer deposition (ALD) process, and may include an oxide, e.g., silicon oxide. The second layer may be formed by a chemical vapor deposition (CVD) process, and may include a nitride, e.g., silicon nitride, or an oxide, e.g., BPSG.

The spacer 230 may be formed on the exposed top surfaces of the first diffusion control pattern 125 and the isolation pattern 105. As an example, the first pattern 210 of the spacer 230 may cover the preliminary fin structure, for example, a lower sidewall of the channel 135, a sidewall of the protrusion 126 of the first diffusion control pattern 125, the exposed top surface of the first diffusion control pattern 125, and the exposed top surface of the isolation pattern 105, and the second pattern 220 of the spacer 230 may be formed on the first pattern 210. Thus, the first and second patterns 210 and 220 may be sequentially stacked on the lower sidewall of the channel 135 in the horizontal direction.

Figure 8:
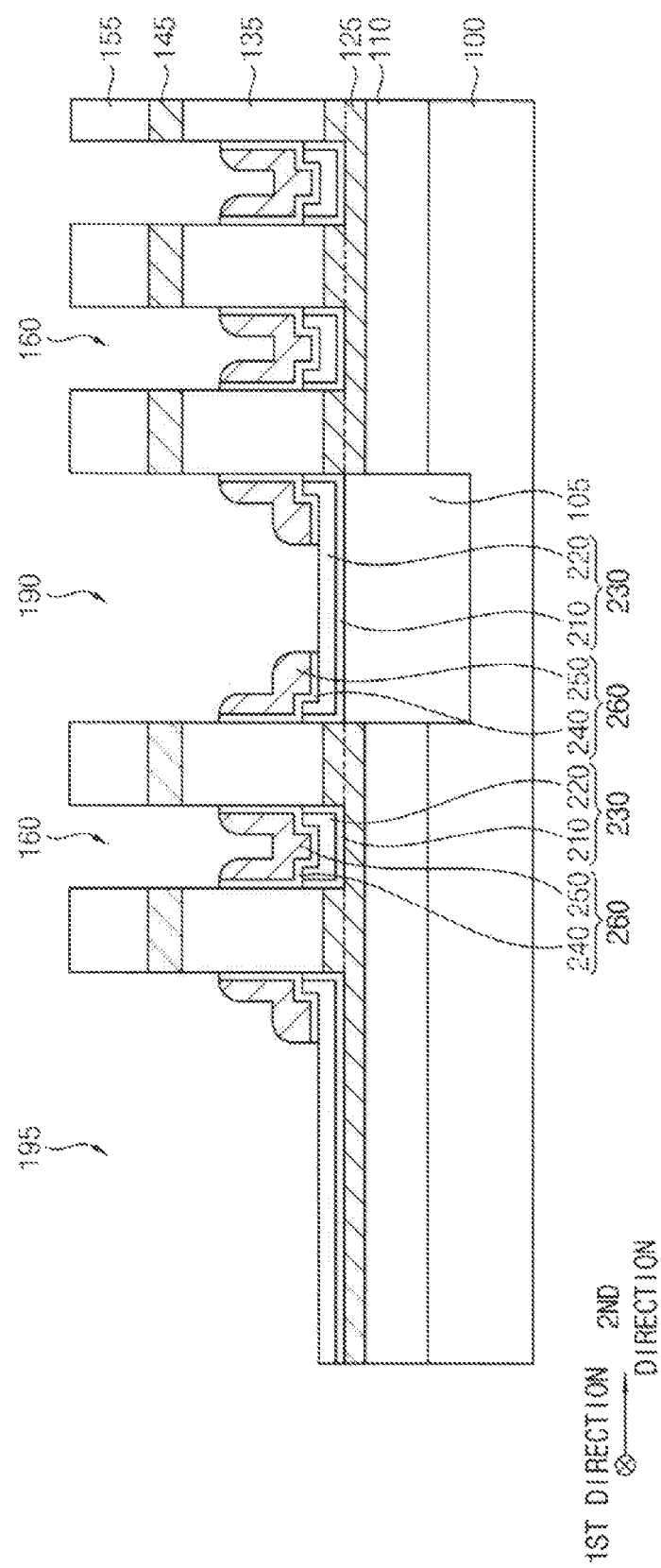

Referring to FIG. 8, a gate insulation layer and a gate electrode layer may be sequentially formed on the spacer 230 and the preliminary fin structures, and may be etched to form a gate structure 260 disposed on sidewalls of the preliminary fin structures and including a gate insulation pattern 240 and a gate electrode 250.

In an exemplary embodiment of the present invention, the gate insulation layer may include a metal oxide, e.g., hafnium oxide, tantalum oxide, or zirconium oxide, and the gate electrode layer may include a metal having a relatively low resistance, e.g., aluminum, copper, or tantalum.

A workfunction control pattern may be formed between the gate insulation pattern 240 and the gate electrode 250, and may include a metal nitride or a metal alloy, e.g., titanium nitride, titanium aluminum, titanium aluminum nitride, tantalum nitride, or tantalum aluminum nitride.

The gate structure 260 may be also formed on an upper surface of the spacer 230. As an example, the gate insulation pattern 240 of the gate structure 260 may cover the preliminary fin structure, for example, a sidewall of the channel 135 and at least a portion of the upper surface of the spacer 230, and the gate electrode 250 may be formed on the gate insulation pattern 240. Thus, the gate insulation pattern 240 and the gate electrode 250 may be sequentially stacked on the central sidewall of the channel 135 in the horizontal direction.

In an exemplary embodiment of the present invention, when a distance between the preliminary fin structures in each of the first and second preliminary fin structure groups is relatively small, the gate structure 260 may extend in the second direction to at least partially cover sidewalls of the preliminary fin structures in each of the first and second preliminary fin structure groups. Alternatively, when the distance between the preliminary fin structures in each of the first and second preliminary fin structure groups is relatively large, a plurality of gate structures 260 may be formed in the second direction to at least partially cover sidewalls of the preliminary fin structures in each of the first and second preliminary fin structure groups. However, one of the gate structures 260 covering the preliminary fin structures in the first preliminary fin structure group and another one of the gate structures 260 covering the preliminary fin structures in the second preliminary fin structure group need not contact each other but may be spaced apart from each other.

Figure 9:
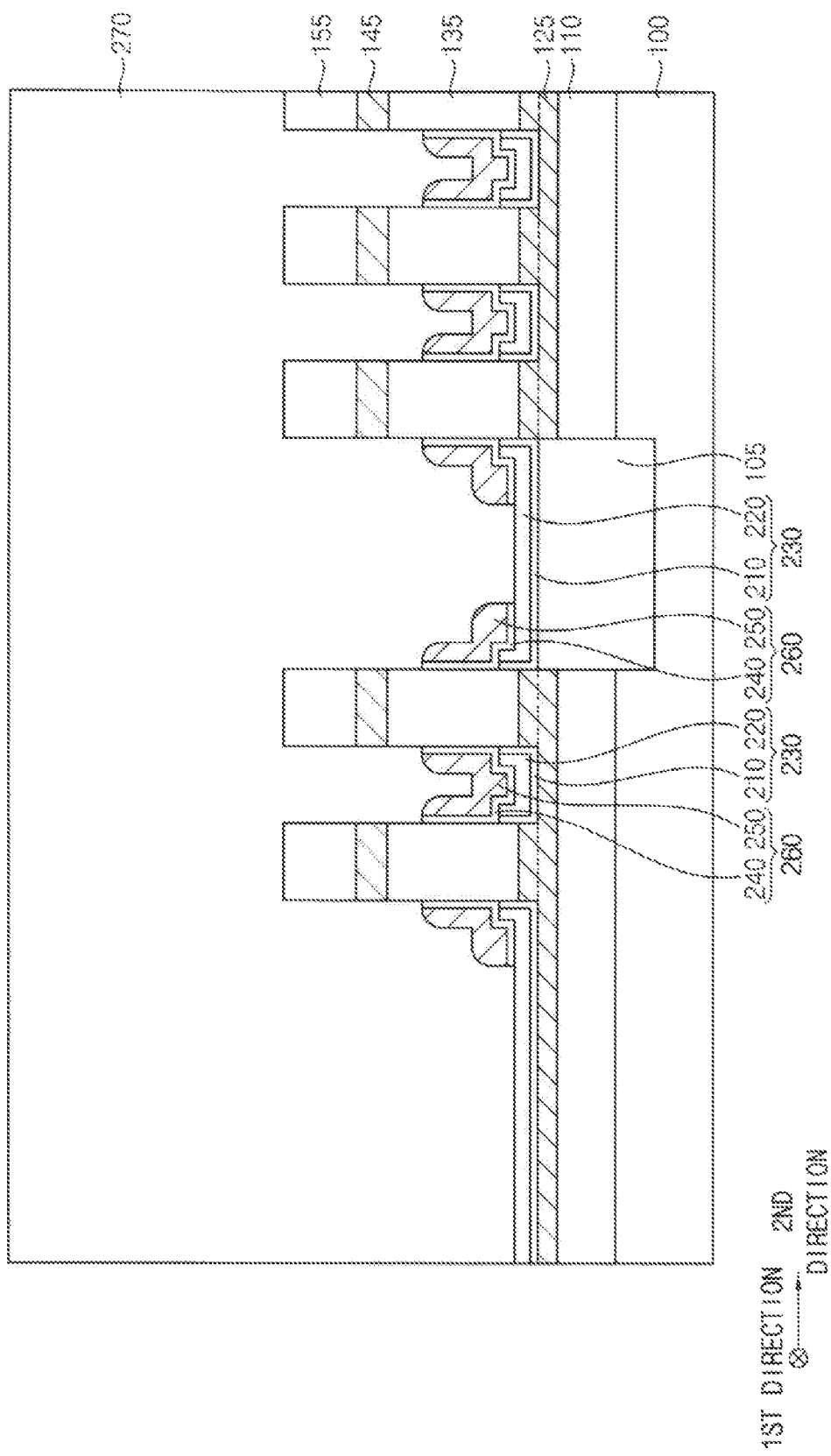

Referring to FIG. 9, an insulating interlayer 270 may be formed on the spacer 230, the gate structures 260, and the preliminary fin structures.

The insulating interlayer 270 may include an oxide, e.g., silicon oxide.

Figure 10:
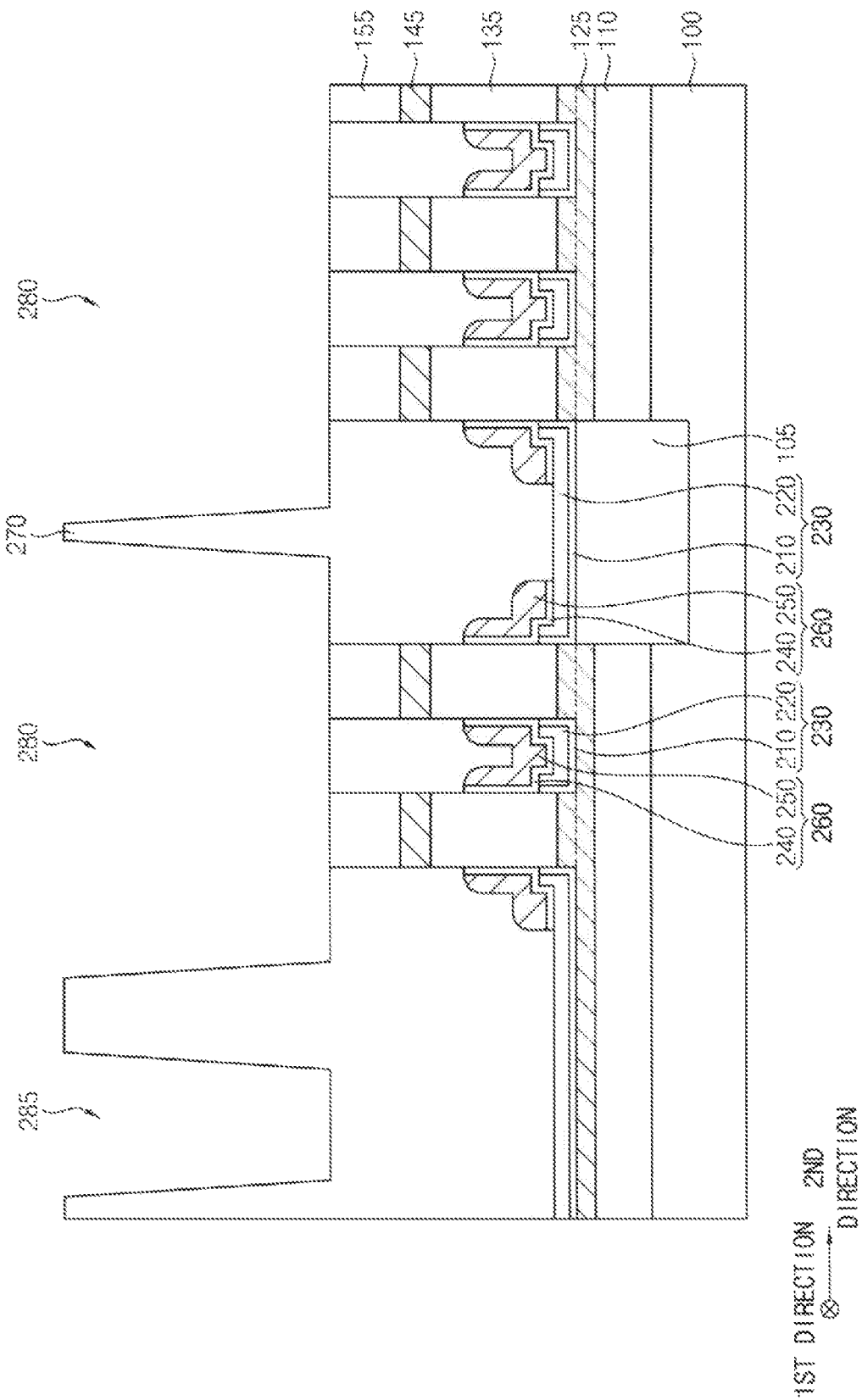

Referring to FIG. 10, an upper portion of the insulating interlayer 270 may be removed by an etching process using a fourth etching mask to form fourth and fifth openings 280 and 285.

In an exemplary embodiment of the present invention, the fourth opening 280 may commonly expose top surfaces of the preliminary fin structures in each of the first and second preliminary fin structure groups, e.g., top surfaces of the masks 155. As an example, the masks 155 may serve as an etching end point in the etching process.

Figure 11:
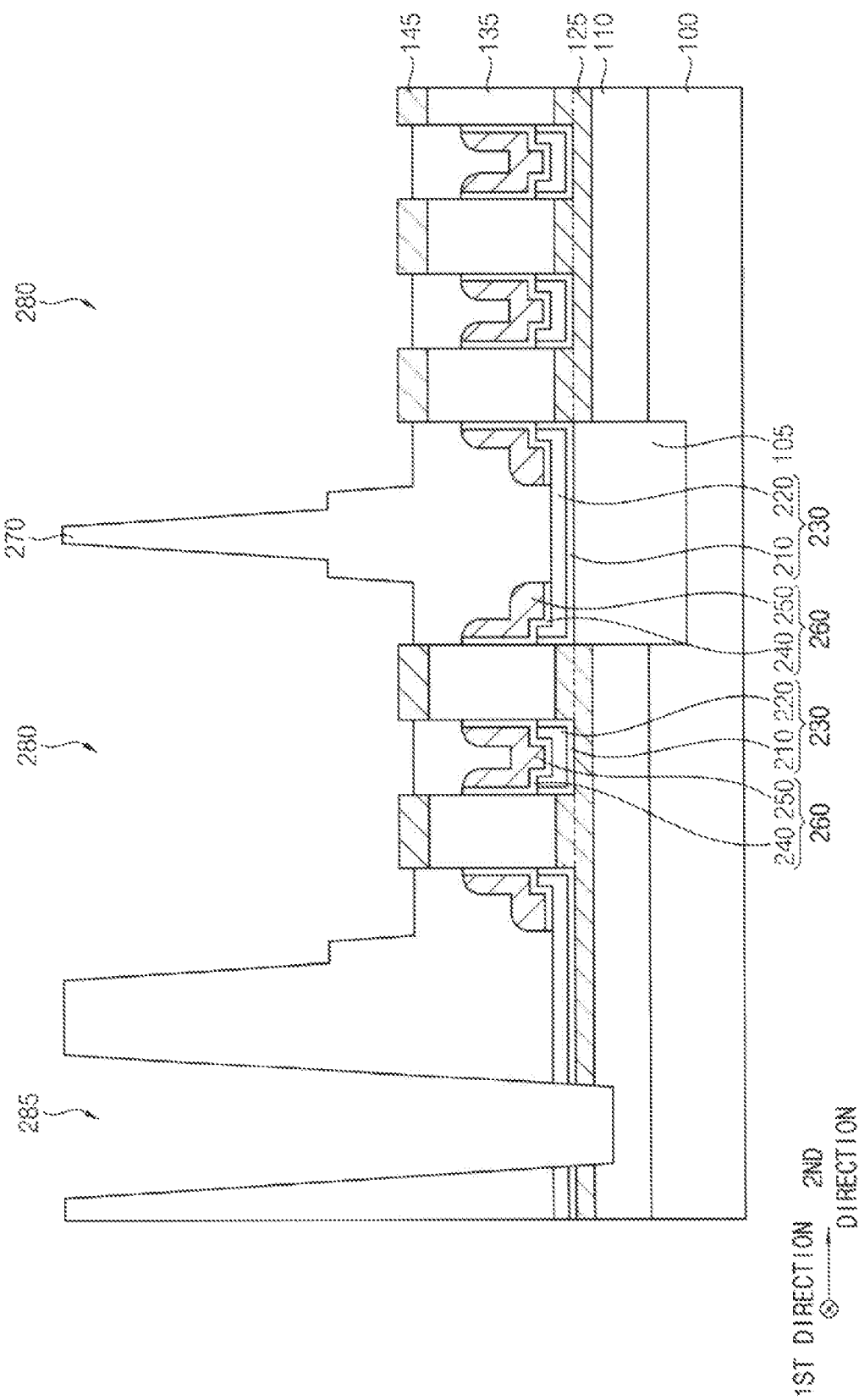

Referring to FIG. 11, a portion of the insulating interlayer 270 and the masks 155 may be removed by an etching process using a fifth etching mask to enlarge the fourth and fifth openings 280 and 285 downwardly (e.g., along a direction orthogonal to an upper surface of the substrate 100).

Thus, the preliminary fin structure including the channel 135, the second diffusion control pattern 145, and the mask 155 sequentially stacked may be transformed into a fin structure including the channel 135 and the second diffusion control pattern 145 sequentially stacked, and the first and second preliminary fin structures may be transformed into first and second fin structures, respectively.

In an exemplary embodiment of the present invention, the enlarged fourth opening 280 may expose top surfaces of the second diffusion control patterns 145. As an example, in the etching process, the second diffusion control patterns 145 may serve as an etching end point. Portions of the insulating interlayer 270 adjacent the second diffusion control patterns 145 may have a top surface lower than those of the second diffusion control pattern 145 but higher than those of the channels 135 (e.g., along a direction orthogonal to an upper surface of the substrate 100). For example, the top surfaces and at least a portion of sidewalls of the second diffusion control patterns 145 may be exposed by the enlarged fourth opening 280, however, sidewalls of the channels 135 need not be exposed by the enlarged fourth opening 280.

The fifth opening 285 may extend through a portion of the spacer 230 under the insulating interlayer 270 to expose the first impurity region 110.

Figure 12:
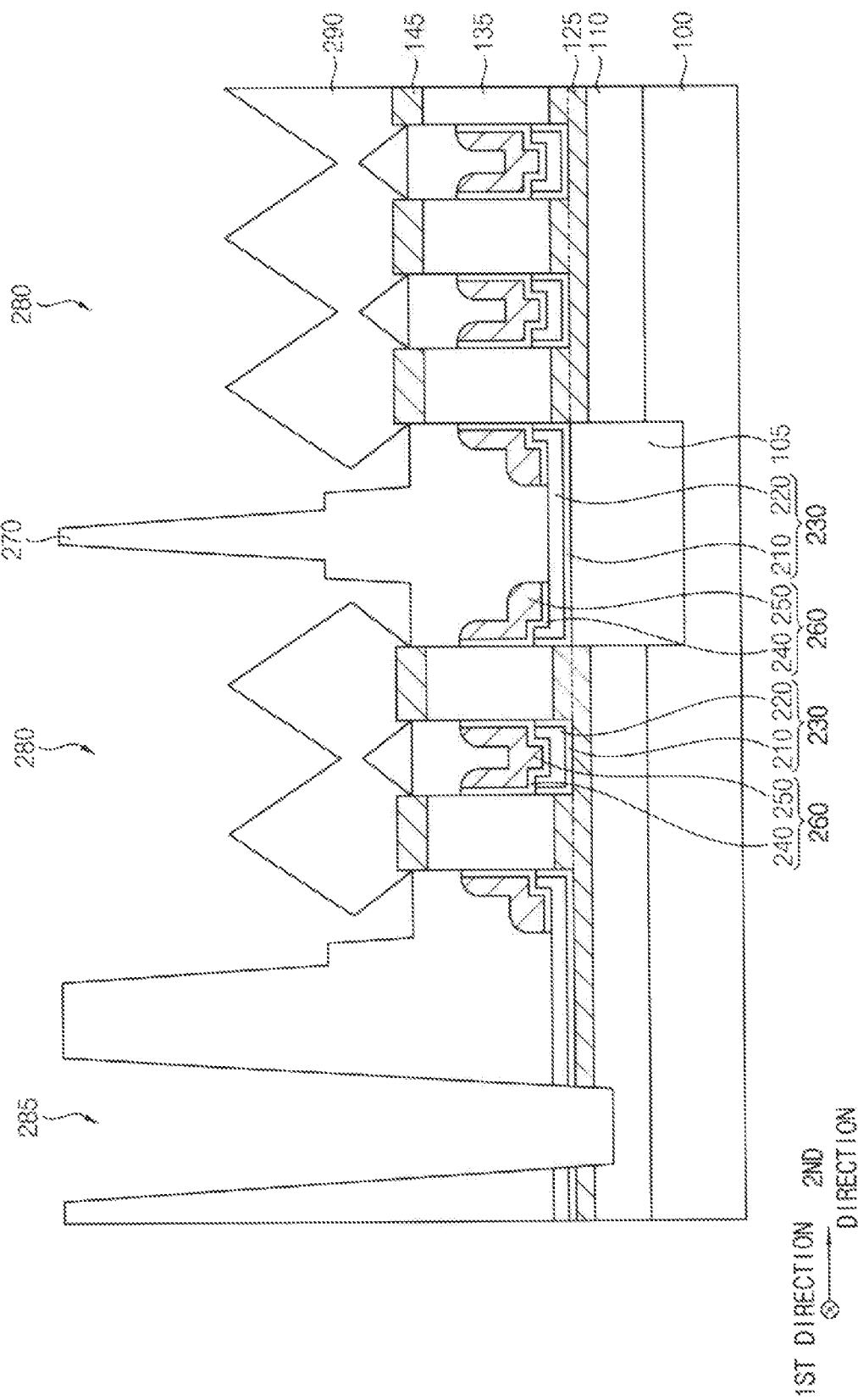

Referring to FIG. 12, a second impurity region 290 may be formed on each of the exposed second diffusion control patterns 145.

In an exemplary embodiment of the present invention, the second impurity region 290 may be formed by a selective epitaxial growth (SEG) process using the top surfaces and the sidewalls of the second diffusion control patterns 145 exposed by the fourth opening 280. Thus, when a p-type vFET is formed on the substrate 100, a single crystalline silicon-germanium layer doped with p-type impurities may be formed to serve as the second impurity region 290, and when an n-type vFET is formed on the substrate 100, a single crystalline silicon layer doped with n-type impurities or a single crystalline silicon carbide layer doped with n-type impurities may be formed to serve as the second impurity region 290.

The second impurity region 290 may be grown in both of the vertical and horizontal directions to have a cross-section taken along the second direction having a shape of a pentagon or hexagon. As an example, the second impurity region 290 may include an upper surface having a positive slope first surface and a negative slope second surface contacting the first surface, and thus the upper surface of the second impurity region 290 may have a sharp shape. For example, the upper surface of the second impurity region 290 may have a zigzag shape.

However, in an exemplary embodiment of the present invention, when the distance between neighboring fin structures in each of the first and second fin structure groups is relatively small, the second impurity regions 290 may be merged to form a single structure.

Before the SEG process, a growth prevention layer including, e.g., a nitride may be formed on an inner wall of the fifth opening 285 so that the second impurity region 290 need not be formed from the first impurity region 110 and the first diffusion control pattern 125 exposed by the fifth opening 285.

Figure 13:
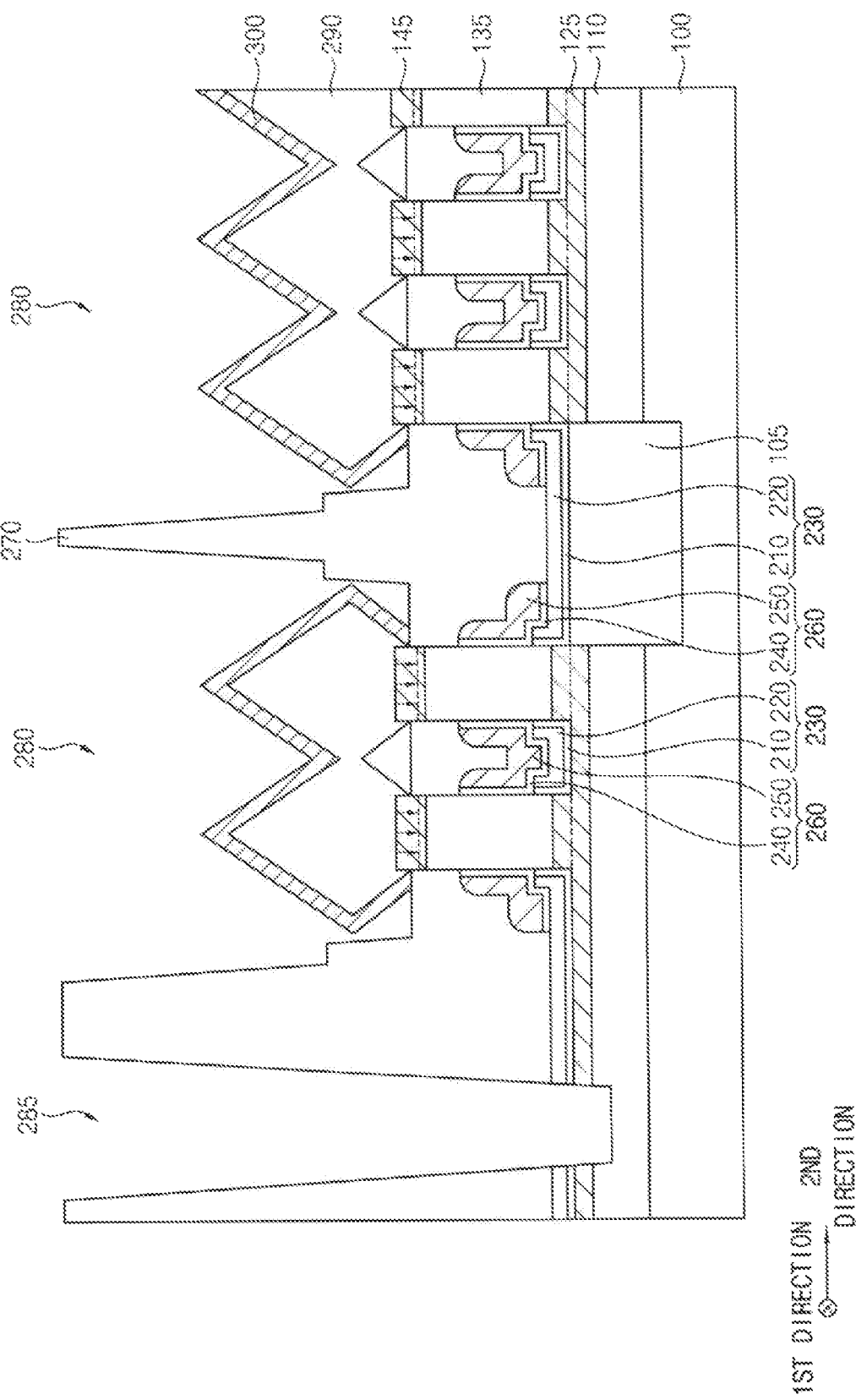

Referring to FIG. 13, a first metal layer may be formed on a surface of the second impurity region 290, inner walls of the fourth and fifth openings 280 and 285, and an upper surface of the insulating interlayer 270, and a heat treatment process may be performed to form a metal silicide pattern 300 on the surface of the second impurity region 290.

The first metal layer may include a metal, e.g., cobalt, or nickel.

During the heat treatment process, second impurities doped in the second impurity region 290 may be diffused downwardly (e.g., along a direction orthogonal to an upper surface of the substrate 100). However, in an exemplary embodiment of the present invention, the downward diffusion of the second impurities may be prevented or controlled by the second diffusion control pattern 145. Even though the second impurities may be diffused into a given depth in the second diffusion control pattern 145 in FIG. 13, exemplary embodiments of the present invention are not limited to a particular depth.

For example, the second impurities may be diffused into an upper portion of the channel 135 through the second diffusion control pattern 145. When compared to a case in which no second diffusion control pattern 145 is formed, the degree of the downward diffusion of the second impurities may be reduced, and the distribution of the downward diffusions of the second impurities at a plurality of second diffusion control patterns 145 or at a plurality of channels 135 may be substantially constant or may have relatively small variations.

Referring to FIG. 1 again, first and second electrodes 310 and 320 may be formed to fill the fourth and fifth openings 280 and 285, respectively.

The first and second electrodes 310 and 320 may be formed by forming a barrier layer on an upper surface of the metal silicide pattern 300, sidewalls of the fourth and fifth openings 280 and 285, and the upper surface of the insulating interlayer 270, forming a second metal layer to fill the fourth and fifth openings 280 and 285 on the barrier layer, and planarizing the second metal layer and the barrier layer until the upper surface of the insulating interlayer 270 may be exposed.

Thus, the first electrode 310 may be formed on the metal silicide pattern 300 to fill the fourth opening 280, and the second electrode 320 may be formed on the first impurity region 110 to fill the fifth opening 285. A spacer under the merged second impurity region 290 in the fourth opening 280 need not be filled with the metal silicide pattern 300 and the first electrode 310, thus forming an air gap 330.

In an exemplary embodiment of the present invention, after forming the second impurity region 290 in the fourth opening 280 in the insulating interlayer 270, the metal silicide pattern 300 and the first electrode 310 may be formed in the fourth opening 280, and thus the upper surface of the second impurity region 290 may keep its original shape. Thus, the contact area between the second impurity region 290 and the metal silicide pattern 300 and the first electrode 310 may increase, which may reduce the resistance therebetween.

However, in Comparative Example, after forming the second impurity region 290 and the insulating interlayer 270 covering the second impurity region 290, the fourth opening 280 exposing the second impurity region 290 may be formed, and the metal silicide pattern 300 and the first electrode 310 may be formed in the fourth opening 280. In this case, when the fourth opening 280 is formed, an upper portion of the second impurity region 290 may be etched so that an upper surface of the second impurity region 290 need not keep its original shape but may be planarized, and thus the contact area between the second impurity region 290 and the metal silicide pattern 300 and the first electrode 310 may decrease, thus increasing the resistance therebetween.

Each of the first and second electrodes 310 and 320 may include a metal pattern and a barrier pattern covering a bottom and a sidewall of the metal pattern.

Contact plugs and upper wirings may be formed on the first and second electrodes 310 and 320, thus completing the semiconductor device according to an exemplary embodiment of the present invention.

Figure 14:
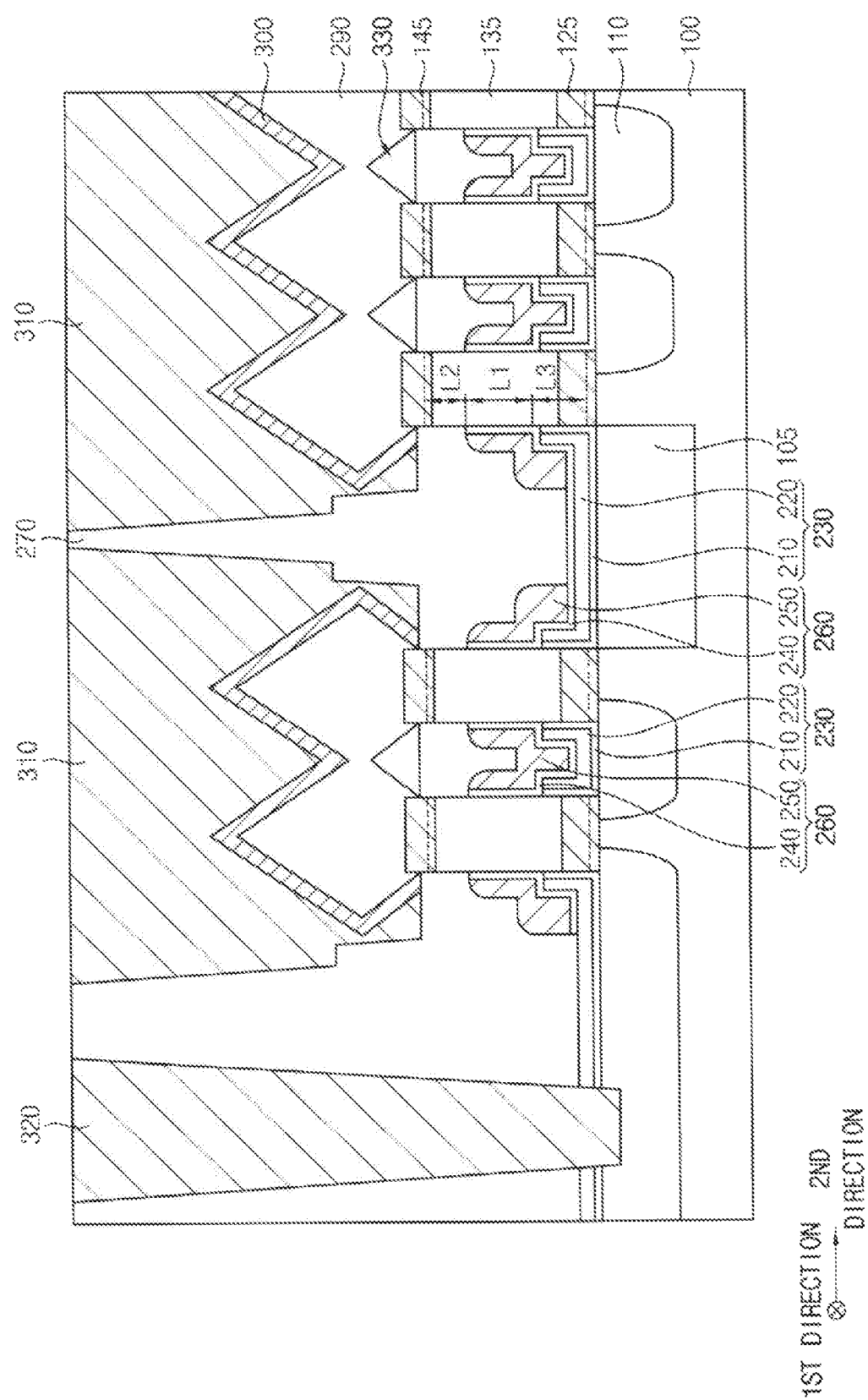
FIG. 14 is a cross-sectional view illustrating a semiconductor device in accordance with an exemplary embodiment of the present invention.

FIG. 14 is a cross-sectional view illustrating a semiconductor device in accordance with an exemplary embodiment of the present invention. This semiconductor device described below with reference to FIG. 14 may be substantially the same as or similar to that described above with reference to FIG. 1, except for the first impurity region, the first diffusion control pattern, and the spacer. Thus, like reference numerals may refer to like elements below, and duplicative descriptions may be omitted below.

Referring to FIG. 14, the first diffusion control pattern 125 may be formed on the substrate 100, and a plurality of first diffusion control patterns 125 may be formed in the second direction. The channel 135 and the second diffusion control pattern 145 sequentially stacked on each of the first diffusion control patterns 125 may form a fin structure.

The first impurity region 110 may be formed at an upper portion of the substrate 100 between the fin structures, and a plurality of first impurity regions 110 may be formed in the second direction. The first impurities doped in the first impurity region 110 may be diffused upwardly (e.g., along a direction orthogonal to an upper surface of the substrate 100), so that a lower portion of each of the first diffusion control patterns 125 may include the first impurities.

The spacer 230 may cover lower portions of the channels 135 and sidewalls of the first diffusion control patterns 125, and may be formed on the first impurity regions 110 and the isolation pattern 105.

In an exemplary embodiment of the present invention, the second and third lengths L2 and L3 may be controlled by the second and first diffusion control patterns 145 and 125, respectively. The distribution of the heights to which the first impurities are diffused in a plurality of vFETs may decrease, so that the third length L3 may have a substantially constant value or relatively small variations. Likewise, the distribution of the depths to which the second impurities are diffused in a plurality of vFETs may decrease, so that the second length L2 may have a substantially constant value or relatively small variations.

Accordingly, each of the second and third lengths L2 and L3 may have a substantially constant value or relatively small variations in the plurality of vFETs, the semiconductor device including the plurality of vFETs may have increased speed and reliability.

FIGS. 15 to 20 are cross-sectional views illustrating a method of manufacturing a semiconductor device in accordance with an exemplary embodiment of the present invention. The method described below with reference to FIGS. 15 to 20 may include processes substantially the same as or similar to those described above with reference to FIGS. 2 to 13, and thus duplicative descriptions may be omitted below.

Figure 15:
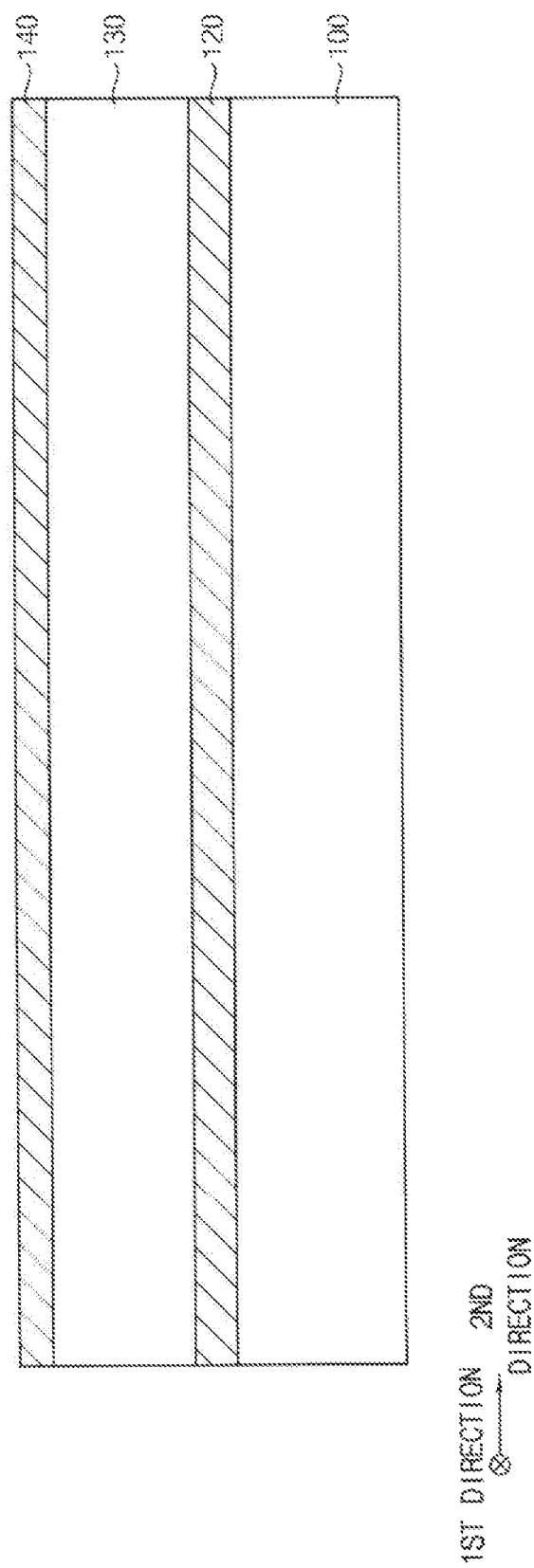
FIGS. 15 to 20 are cross-sectional views illustrating a method of manufacturing a semiconductor device in accordance with an exemplary embodiment of the present invention.

Referring to FIG. 15, processes substantially the same as or similar to those described above with reference to FIG. 2 may be performed. However, the first impurity region 110 need not be formed.

Figure 16:
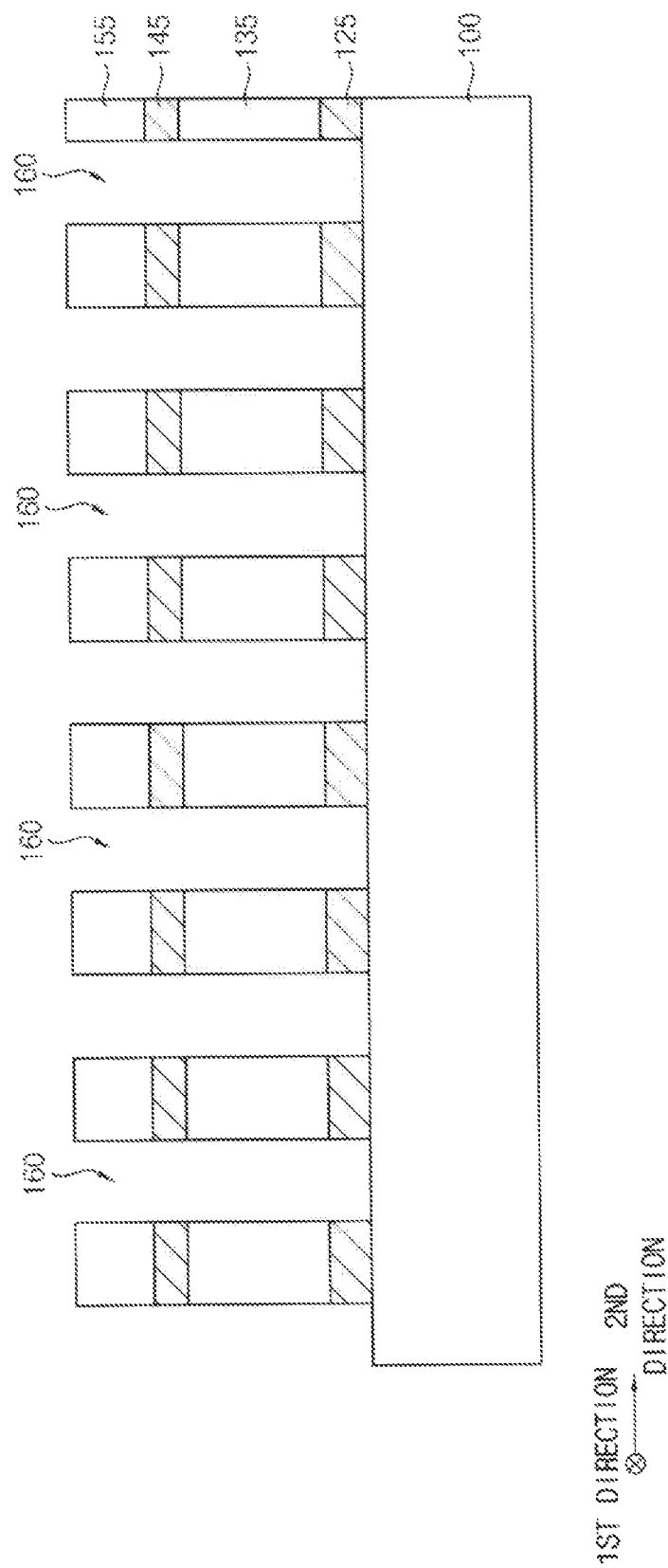

Referring to FIG. 16, processes similar to those described above with reference to FIG. 4 may be performed.

However, the first opening 160 formed in the etching process using the mask 155 as an etching mask may extend through a lower portion of the first diffusion control layer 120, and thus the first diffusion control layer 120 may be divided into a plurality of first diffusion control patterns 125.

Figure 17:
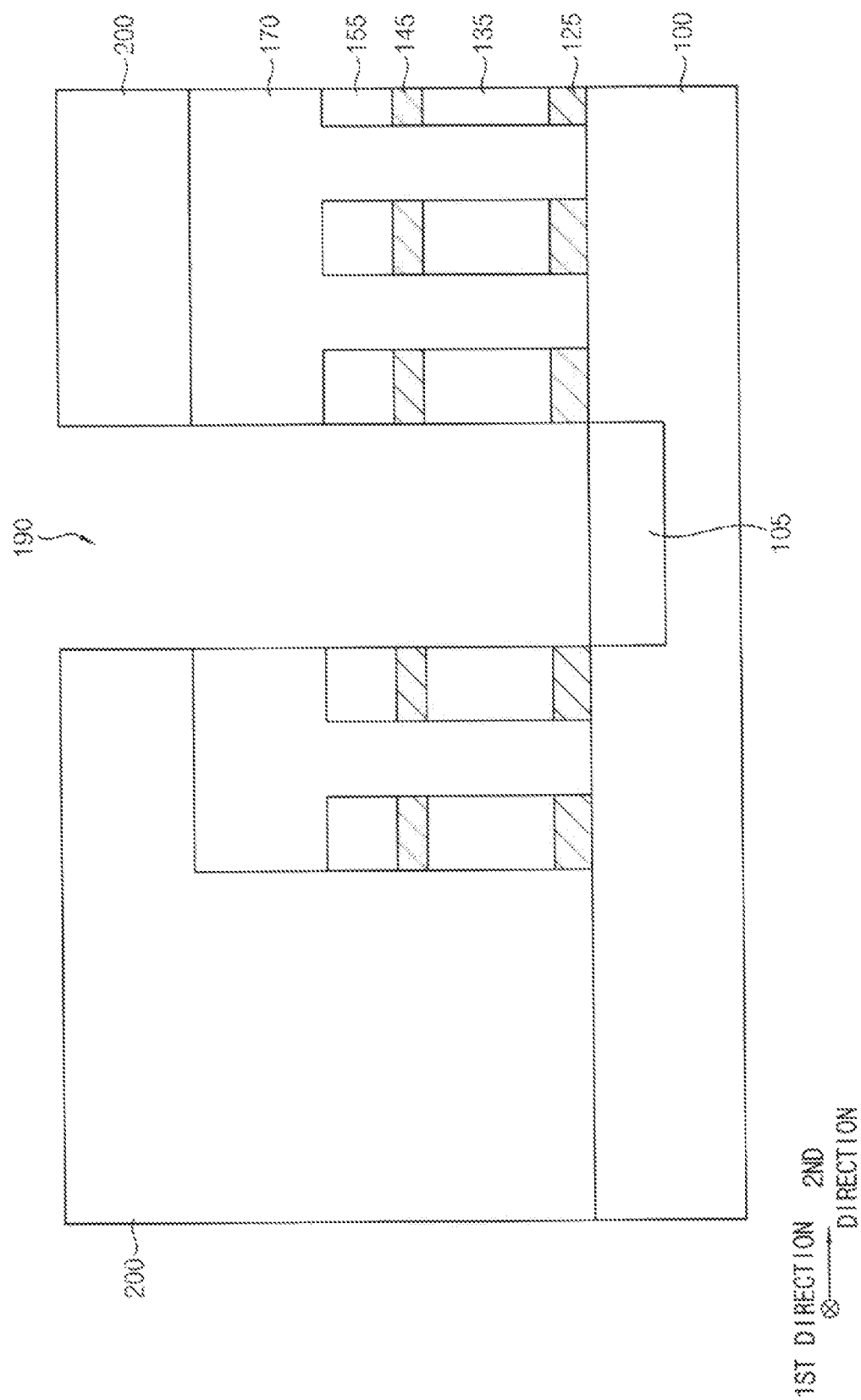

Referring to FIG. 17, processes substantially the same as or similar to those described above with reference to FIGS. 5 and 6 may be performed.

Thus, some of the preliminary fin structures may be removed to form the second and third openings 190 and 195, and an upper portion of the substrate 100 exposed by the second opening 190 may be removed and filled with the isolation pattern 105.

In an exemplary embodiment of the present invention, the isolation pattern 105 may have a top surface substantially coplanar with that of the substrate 100; however, exemplary embodiments of the present invention are not limited thereto.

Figure 18:
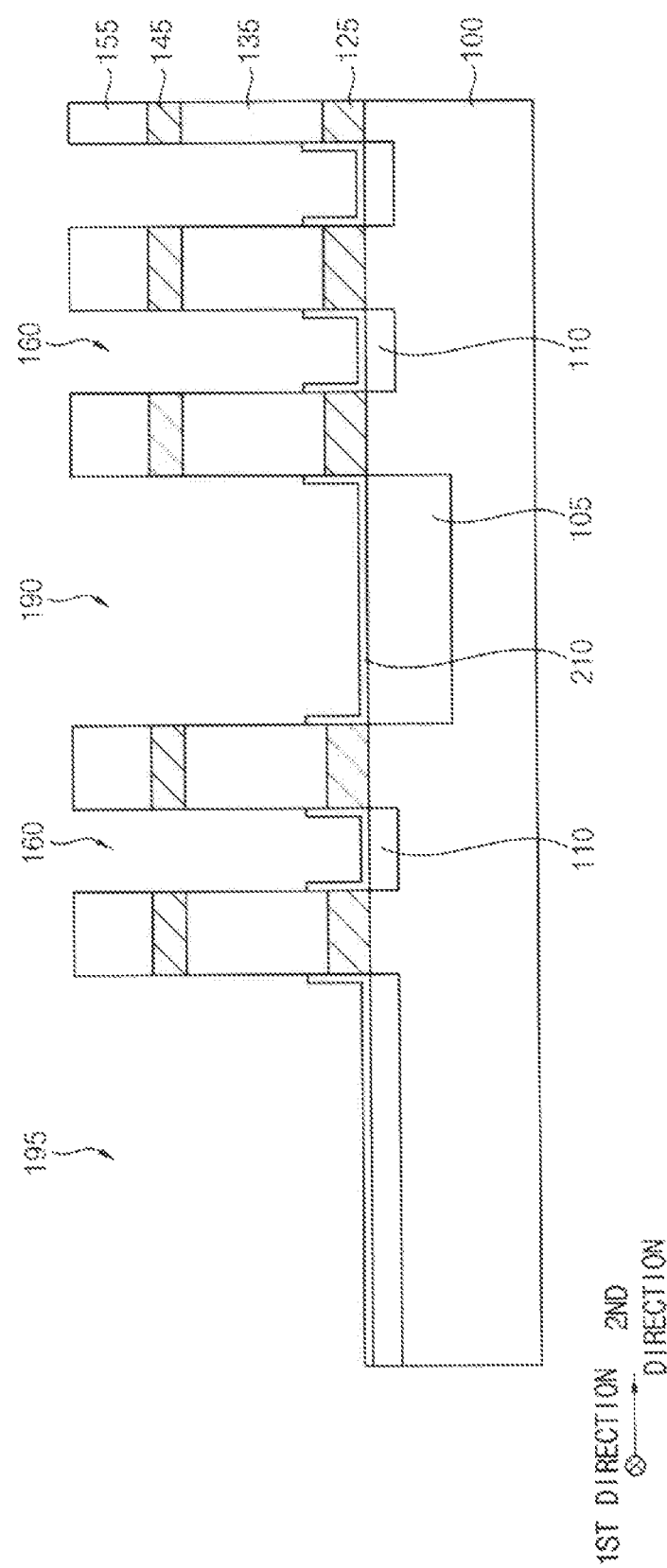

Referring to FIG. 18, after removing the first and third etching masks 170 and 200, the process for forming the first pattern 210 of the spacer 230 described above with reference to FIG. 7 may be performed.

The ion implantation process for forming the first impurity region 110 described above with reference to FIG. 2 may be performed. The first impurity region 110 may be formed at an upper portion of the substrate 100 between the preliminary fin structures by the ion implantation process, and thus a plurality of first impurity regions 110 may be formed in the second direction spaced apart from each other.

Figure 19:
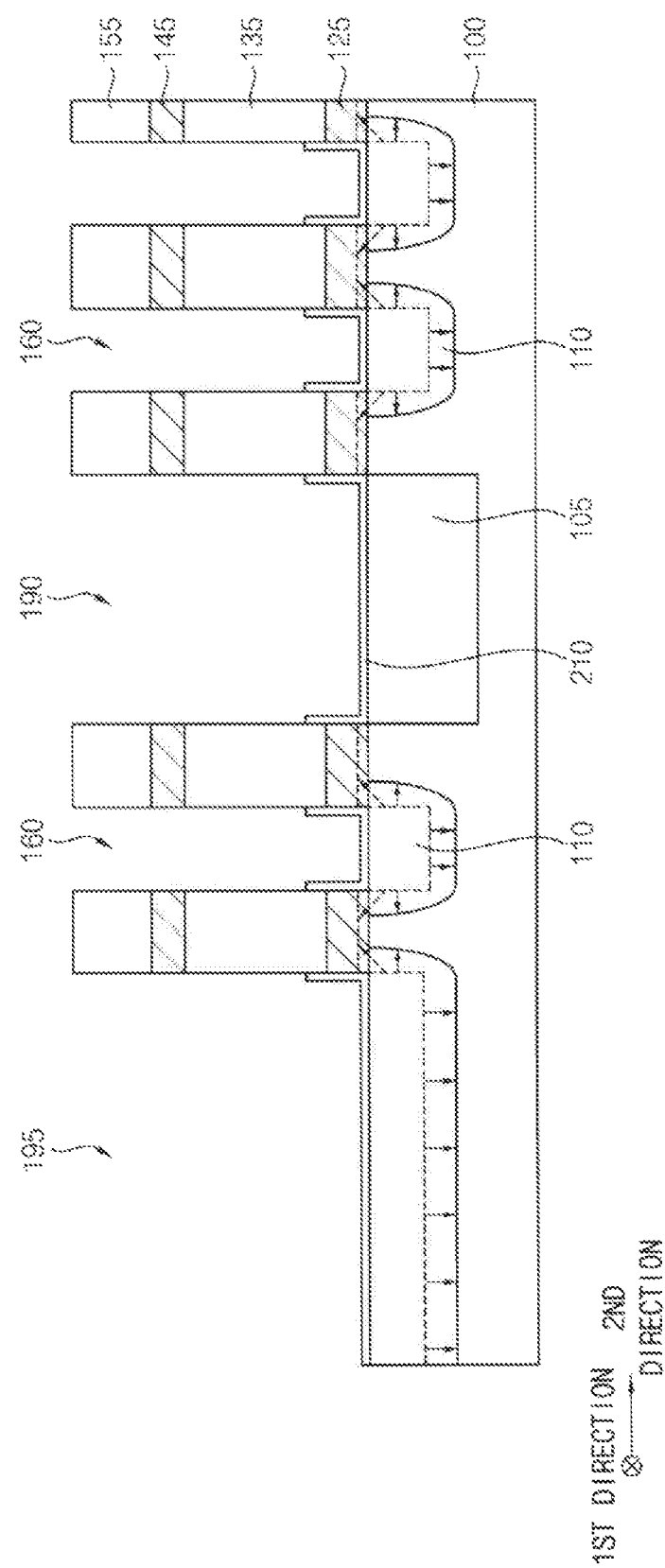

Referring to FIG. 19, the heat treatment process described above with reference to FIG. 3 may be performed to activate the first impurity region 110.

Thus, the first impurities doped in the first impurity regions 110 may be diffused in both of the vertical and horizontal directions. However, the upward diffusion of the first impurities may be prevented or controlled by the first diffusion control patterns 125 under the respective channels 135, and thus the first impurities may be diffused to a given height in each of the first diffusion control patterns 125.

When compared to a case in which no first diffusion control pattern 125 is formed, the degree of the upward diffusion of the first impurities may be reduced, and the distribution of the upward diffusions of the first impurities of the first impurity regions 110 may be also reduced. Thus, the heights to which the first impurities are diffused in the respective first diffusion control patterns 125 may be substantially constant or may have relatively small variations.

The lower portions of the first diffusion control patterns 125 may further include the first impurities of the first impurity region 110 by the heat treatment process.

Figure 20:
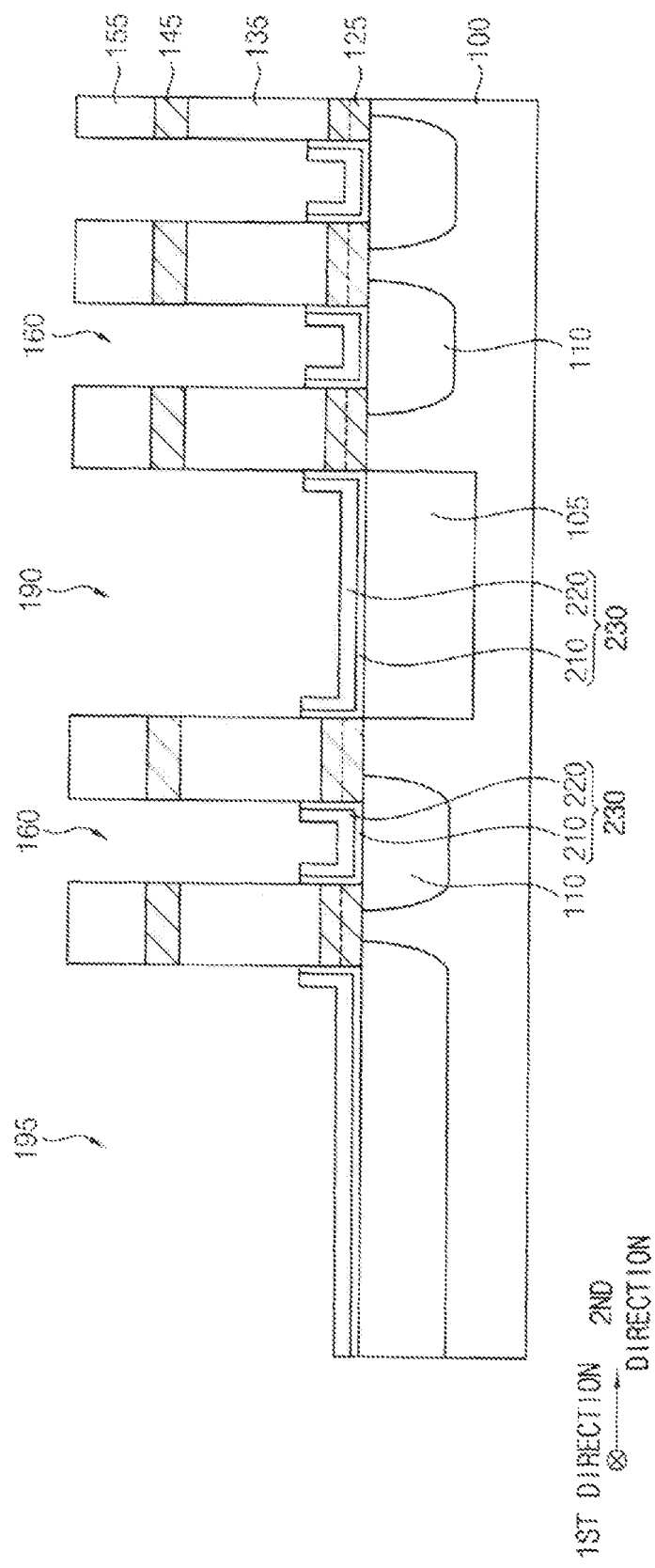

Referring to FIG. 20, the process for forming the second pattern 220 of the spacer 230 described above with reference to FIG. 7 may be performed.

Referring to FIG. 14 again, processes substantially the same as or similar to those described above with reference to FIGS. 8 to 13 and FIG. 1 may be performed, thus completing the semiconductor device according to an exemplary embodiment of the present invention.

The semiconductor device in accordance with an exemplary embodiment of the present invention may be applied to logic devices, e.g., CPUs, MPUs, or APs, volatile memory devices, e.g., SRAMs, or DRAMs, or non-volatile memory devices, e.g., flash memory devices, PRAMs, MRAMs, or RRAMs.

While example embodiments have been particularly shown and described, it will be understood by one of ordinary skill in the art that variations in form and detail may be made therein without departing from the spirit and scope of the present invention.

What is claimed is:

1. A vertical field effect transistor (vFET), comprising:
    a first impurity region including silicon doped with first impurities at an upper portion of a substrate;
    a first diffusion control pattern on the first impurity region, the first diffusion control pattern being configured to control the diffusion of the first impurities, the first diffusion control pattern having a lower portion and an upper portion sequentially stacked, the lower portion including silicon-germanium doped with the first impurities, and the upper portion including undoped silicon-germanium or silicon-germanium doped with impurities having a conductivity type different from that of the first impurities;
    a channel extending in a vertical direction on the first diffusion control pattern, the vertical direction substantially orthogonal to an upper surface of the substrate;
    a second impurity region including silicon doped with second impurities on the channel;
    a second diffusion control pattern between the channel and the second impurity region, the second diffusion control pattern being configured to control the diffusion of the second impurities, the second diffusion control pattern having a lower portion and an upper portion sequentially stacked, the upper portion including silicon-germanium doped with the second impurities, and the lower portion including undoped silicon-germanium or silicon-germanium doped with impurities having a conductivity type different from that of the second impurities;
    a gate structure adjacent to the channel, the gate structure covering only a portion of a sidewall of the channel such that a top surface of a portion of the gate structure covering the portion of the sidewall of the channel is lower than a bottom surface of the second diffusion control pattern;
    a first electrode on the second impurity region; and
    a second electrode on the first impurity region, the second electrode being spaced apart from the gate structure,
    wherein the upper portion of the first diffusion control pattern, the channel, and the second diffusion control pattern sequentially stacked on the lower portion of the first diffusion control pattern form a fin structure.

2. The vFET of claim 1, wherein a bottom surface of a portion of the gate structure covering the portion of the sidewall of the channel is higher than a top surface of the first diffusion control pattern.

3. The vFET of claim 1, wherein the second electrode is in direct contact with the first impurity region.

4. The vFET of claim 1, wherein top surfaces of the first and second electrodes are substantially coplanar with each other.

5. The vFET of claim 1, wherein a central upper portion of the second impurity region has a sharp upper surface, and
wherein the vFET further comprises a metal silicide pattern between the second impurity region and the first electrode, the metal silicide pattern covering the upper surface of the second impurity region.

6. The vFET of claim 1, further comprising a spacer under the gate structure, the spacer covering a lower portion of the channel.

7. The vFET of claim 6, wherein the spacer includes:
a first pattern covering a lower sidewall of the channel and including silicon oxide; and
a second pattern conformally disposed on the first pattern, the second pattern including silicon nitride.

8. The vFET of claim 1, wherein the gate structure includes:
a gate insulation pattern disposed on a central sidewall of the channel and including a high-k dielectric material; and
a gate electrode on the gate insulation pattern, the gate electrode including a metal.

9. A semiconductor device, comprising:
an isolation pattern on a substrate;
a first impurity region doped with first impurities at each of opposite sides of the isolation pattern on a substrate;
a first diffusion control pattern on the first impurity region, the first diffusion control pattern being configured to control the diffusion of the first impurities, the first diffusion control pattern having a lower portion and two upper portions, the two upper portions being spaced apart from each other along a direction parallel to an upper surface of the substrate and protruding from the lower portion in a vertical direction substantially orthogonal to the upper surface of the substrate, the lower portion including silicon-germanium doped with the first impurities, and each of the two upper portions including undoped silicon-germanium or silicon-germanium doped with impurities having a conductivity type different from that of the first impurities;
channels on the two upper portions, respectively, of the first diffusion control pattern, each of the channels extending in the vertical direction;
a second impurity region contacting upper surfaces of both of the channels, the second impurity region being doped with second impurities;
second diffusion control patterns on the channels, respectively, under the second impurity region, each of the second diffusion control patterns being configured to control the diffusion of the second impurities and having a lower portion and an upper portion sequentially stacked, the upper portion including silicon-germanium doped with the second impurities, and the lower portion including undoped silicon-germanium or silicon-germanium doped with impurities having a conductivity type different from that of the second impurities; and
two gate structures adjacent to the channels, respectively, the two gate structures partially covering sidewalls of the channels such that top surfaces of portions of the gate structures covering the sidewalls of the respective channels are lower than bottom surfaces of the respective second diffusion control patterns,
wherein distances in the vertical direction from the top surfaces of the portions of the gate structures covering the sidewalls of the respective channels to bottom surfaces of the upper portions of the respective second diffusion control patterns are substantially constant.

10. The semiconductor device of claim 9, wherein distances in the vertical direction from bottom surfaces of the portions of the gate structures covering the sidewalls of the respective channels to top surfaces of the lower portion of the first diffusion control pattern are substantially constant.

11. The semiconductor device of claim 9, wherein an air gap is formed between the second diffusion control patterns under the second impurity region.

12. The semiconductor device of claim 9, wherein the first diffusion control patterns on the respective first impurity regions are spaced apart from each other by the isolation pattern.

13. The semiconductor device of claim 9, further comprising a spacer covering sidewalls of lower portions of the channels and the upper portions of the first diffusion control pattern.

14. The semiconductor device of claim 13, wherein the two upper portions of the first diffusion control pattern are spaced apart from each other by the spacer.

15. The semiconductor device of claim 9, wherein the second impurity region has an uneven upper surface.

16. The semiconductor device of claim 15, further comprising:
a metal silicide pattern covering the upper surface of the second impurity region;
a first electrode on the metal silicide pattern; and
a second electrode on the first impurity region, the second electrode being spaced apart from the two gate structures.

17. A semiconductor device, comprising:
first diffusion control patterns spaced apart from each other on a substrate;
first impurity regions doped with first impurities at upper portions, respectively, of the substrate, the first impurity regions being between the first diffusion control patterns in a plan view;
channels on the respective first diffusion control patterns, each of the channels extending in a vertical direction substantially orthogonal to an upper surface of the substrate;
second impurity regions on the respective channels, the second impurity regions being doped with second impurities;
second diffusion control patterns between the channels and the second impurity regions, respectively, the second diffusion control patterns being configured to control the diffusion of the second impurities; and
gate structures adjacent to the respective channels, the gate structures partially covering sidewalls of the respective channels such that top surfaces of portions of the gate structures covering the sidewalls of the respective channels are lower than bottom surfaces of the respective second diffusion control patterns,
wherein each of the first diffusion control patterns has a lower portion and an upper portion sequentially stacked, the lower portion including silicon-germanium doped with the first impurities, and the upper portions including undoped silicon-germanium or silicon-germanium doped with impurities having a conductivity type different from that of the first impurities,
wherein each of the second diffusion control patterns has a lower portion and an upper portion sequentially stacked, the upper portion including silicon-germanium doped with the second impurities, and the lower portion including undoped silicon-germanium or silicon-germanium doped with impurities having a conductivity type different from that of the second impurities, and wherein top surfaces of the first impurity regions and bottom surfaces of the first diffusion control patterns are substantially coplanar with each other, and bottom surfaces of the gate structures are lower than top surfaces of the first diffusion control patterns.

18. The semiconductor device of claim 17, wherein at least a portion of each of the first diffusion control patterns overlap one of the first impurity regions in the vertical direction.

19. The semiconductor device of claim 17, wherein distances in the vertical direction from the top surfaces of the portions of the gate structures covering the sidewalls of the respective channels to bottom surfaces of the upper portions of the respective second diffusion control patterns are substantially constant, and distances in the vertical direction from bottom surfaces of the portions of the gate structures covering the sidewalls of the respective channels to top surfaces of the lower portion of the first diffusion control pattern are substantially constant.

20. The semiconductor device of claim 17, wherein the second impurity regions on the respective channels are merged with each other to form a single second impurity region, and wherein an air gap is formed between the second diffusion control patterns under the single second impurity region.

* * * * *